(12) United States Patent
Kudo et al.

(10) Patent No.: US 10,468,283 B2
(45) Date of Patent: Nov. 5, 2019

(54) ION IMPLANTATION APPARATUS AND METHOD FOR PROCESSING PLURALITY OF WAFERS USING THE SAME

(71) Applicant: Sumitomo Heavy Industries Ion Technology Co., Ltd., Tokyo (JP)

(72) Inventors: Tetsuya Kudo, Ehime (JP); Shinji Ebisu, Ehime (JP); Yoshito Fujii, Ehime (JP)

(73) Assignee: SUMITOMO HEAVY INDUSTRIES ION TECHNOLOGY CO., LTD., Tokyo (JP)

( * ) Notice: Subject to any disclaimer, the term of this patent is extended or adjusted under 35 U.S.C. 154(b) by 365 days.

(21) Appl. No.: 15/228,754

(22) Filed: Aug. 4, 2016

(65) Prior Publication Data

US 2017/0040197 A1    Feb. 9, 2017

(30) Foreign Application Priority Data

Aug. 6, 2015    (JP) .................. 2015-156435

(51) Int. Cl.
*H01L 21/67* (2006.01)
*H01L 21/677* (2006.01)
(Continued)

(52) U.S. Cl.
CPC ........ *H01L 21/67778* (2013.01); *C23C 14/48* (2013.01); *H01L 21/67196* (2013.01); *H01L 21/67201* (2013.01); *H01L 21/67213* (2013.01); *H01L 21/67742* (2013.01); *H01L 21/67745* (2013.01); *H01L 21/67748* (2013.01); *H01L 21/67766* (2013.01); *H01L 21/68* (2013.01); *H01L 21/68764* (2013.01);
(Continued)

(58) Field of Classification Search
CPC ........................................................ H01L 21/67
USPC ........................................................ 414/217
See application file for complete search history.

(56) References Cited

U.S. PATENT DOCUMENTS

| 8,096,744 B2 | 1/2012 | Okada et al. | |
| 2008/0138175 A1* | 6/2008 | Mitchell | H01L 21/67265 414/217 |
| 2008/0138178 A1 | 6/2008 | Ferrara et al. | |

FOREIGN PATENT DOCUMENTS

| JP | 2000-012647 A | 1/2000 |
| JP | 4296675 B2 | 7/2009 |

(Continued)

*Primary Examiner* — Saul Rodriguez
*Assistant Examiner* — Willie Berry, Jr.
(74) *Attorney, Agent, or Firm* — Michael Best & Friedrich LLP

(57) ABSTRACT

A first conveyance mechanism and a second conveyance mechanism convey a pair of two wafers to an alignment device from a wafer container via a buffer device, and then bring the wafers respectively into a first load lock chamber and a second load lock chamber after alignment. An intermediate conveyance mechanism conveys one of the pair of two wafers between the first load lock chamber and a vacuum processing chamber. The intermediate conveyance mechanism conveys the other of the pair of two wafers between the second load lock chamber and the vacuum processing chamber. The first conveyance mechanism and the second conveyance mechanism take out the pair of two wafers subjected to an implantation process from the first load lock chamber and the second load lock chamber and store the wafers into the wafer container.

15 Claims, 20 Drawing Sheets

(51) Int. Cl.
*C23C 14/48* (2006.01)
*H01L 21/68* (2006.01)
*H01L 21/687* (2006.01)

(52) U.S. Cl.
CPC ... *H01J 2237/184* (2013.01); *H01J 2237/204* (2013.01); *H01J 2237/20207* (2013.01); *H01J 2237/31701* (2013.01)

(56) References Cited

FOREIGN PATENT DOCUMENTS

| | | |
|---|---|---|
| JP | 2010-512025 A | 4/2010 |
| JP | 4907077 B2 | 3/2012 |
| JP | 5323718 B2 | 10/2013 |

\* cited by examiner

ION IMPLANTATION APPARATUS AND METHOD FOR PROCESSING PLURALITY OF WAFERS USING THE SAME

RELATED APPLICATION

Priority is claimed to Japanese Patent Application No. 2015-156435, filed on Aug. 6, 2015, the entire content of which is incorporated herein by reference.

BACKGROUND OF THE INVENTION

1. Field of the Invention

The present invention relates to an ion implantation apparatus and a control method for an ion implantation apparatus.

2. Description of the Related Art

In a semiconductor production process, a process of implanting ions into a semiconductor wafer (hereinafter, it may be referred to as an "ion implantation process") is generally performed for the purpose of changing the conductivity and/or the crystalline structure of the semiconductor and the like. An apparatus that is used in the ion implantation process is called an ion implantation apparatus and has a function of forming an ion beam by generating ions using an ion source and accelerating the generated ions and a function of transporting the ion beam to a vacuum processing chamber and irradiating a wafer with the ion beam inside the vacuum processing chamber. In addition, in the ion implantation apparatus, a device that supplies a wafer before the implantation of ions to the vacuum processing chamber and takes out the wafer to which the ions have been implanted (hereinafter, it may be referred to as a "wafer conveyance device") is disposed.

The wafer conveyance device includes a load lock chamber used for bringing a wafer placed under the atmospheric pressure into the vacuum processing chamber. After bringing a wafer into the load lock chamber under the atmospheric pressure, the wafer conveyance device evacuates the load lock chamber, causes the load lock chamber that is in the vacuum state and the vacuum processing chamber to communicate with each other, and brings the wafer into the vacuum processing chamber. Since a time required for bringing the wafer into is highly influenced by an evacuation time of the load lock chamber, the processing capability of wafer conveyance can be increased by arranging a plurality of load lock chambers. For example, as a wafer conveyance device of which the conveyance capability is increased, a configuration is employed in which two load lock chambers are arranged on a right side and a left side and an intermediate conveyance chamber is arranged between the load lock chambers and the a vacuum processing chamber.

In addition, as a wafer conveyance device of which the conveyance capability is further increased, a configuration is also proposed in which each of a right load lock chamber and a left load lock chamber is configured to be a two stage type, and thus four load lock chambers in total are provided. In the conveyance device, a two-stage-type wafer conveyance robot and/or a two-stage-type alignment mechanism is provided corresponding to the two-stage-type load lock chamber.

The conveyance capability can be increased by employing the two-stage-type load lock chamber. However, since each of the load lock chamber, the wafer conveyance robot and the alignment mechanism is configured to be a two stage type, structure of each device is complex. Therefore, production cost or maintenance cost is increased compared to the case of a one stage type. Inventors of the present invention are considered that there is room to improve wafer conveyance capability by enhancing efficiency of a conveyance process between a wafer container and a load lock chamber even in a case where a one-stage-type right load lock chamber and a one-stage-type left load lock chamber are used.

SUMMARY OF THE INVENTION

The present invention is made in consideration of such situations, and an object thereof is to provide a technology capable of improving wafer conveyance capability in relation to a configuration using a one-stage-type right load lock chamber and a one-stage-type left load lock chamber.

In order to solve the problem described above, according to an aspect of the present invention, there is provided an ion implantation apparatus including: a vacuum processing chamber in which an ion implantation process is performed; an intermediate conveyance chamber that is provided to communicate with the vacuum processing chamber; a first load lock chamber and a second load lock chamber that are respectively provided at positions at which the first load lock chamber and the second load lock chamber face each other with interposing the intermediate conveyance chamber and communicate with the intermediate conveyance chamber; an intermediate conveyance mechanism that is provided in the intermediate conveyance chamber and performs wafer conveyance between the vacuum processing chamber and the first load lock chamber via the intermediate conveyance chamber and wafer conveyance between the vacuum processing chamber and the second load lock chamber via the intermediate conveyance chamber; a first conveyance mechanism that is provided at a position at which the first conveyance mechanism faces the first load lock chamber, brings a wafer into the first load lock chamber, and takes out a wafer from the first load lock chamber; a second conveyance mechanism that is provided at a position at which the second conveyance mechanism faces the second load lock chamber, brings a wafer into the second load lock chamber, and takes out a wafer from the second load lock chamber; an alignment device that is provided at a position between the first conveyance mechanism and the second conveyance mechanism and configured to be able to adjust a rotation position of a wafer; a buffer device that is provided at a position between the first conveyance mechanism and the second conveyance mechanism and configured to be able to temporarily hold two or more wafers; a load port that allows a wafer container in which a plurality of wafers that are targets of the ion implantation process are stored to be fixed at a position at which the wafer container faces the first conveyance mechanism; and a controller that controls operations of at least the first conveyance mechanism and the second conveyance mechanism. In the ion implantation apparatus, the first conveyance mechanism has a first arm capable of holding a wafer and a second arm capable of holding a wafer. In addition, the second conveyance mechanism has a third arm capable of holding a wafer and a fourth arm capable of holding a wafer. Furthermore, in relation to a first wafer and a second wafer of the plurality of wafers that are stored in the wafer container, conveyed in order, and become targets of the ion implantation process, (a) the controller operates the first conveyance mechanism such that the first arm and the second arm convey the first wafer and the second wafer to the buffer device from the wafer container, (b) the controller operates the second conveyance mechanism such that the third arm conveys the first wafer to the alignment device from the buffer device and the fourth arm takes out the second wafer from the buffer device and temporarily holds the second wafer, (c) the controller operates the second conveyance mechanism such that the third arm takes out the first wafer subjected to alignment from the alignment device and the fourth arm brings the second wafer into the alignment device, (d) the controller operates the second conveyance mechanism such that the third arm brings the first wafer subjected to alignment into the second load lock chamber, and (e) the controller operates the first conveyance mechanism such that the first arm conveys the second wafer subjected to alignment to the first load lock chamber from the alignment device.

According to another aspect of the present invention, there is provided a processing method. This method is a method for processing a plurality of wafers using an ion implantation apparatus, and the ion implantation apparatus includes: a vacuum processing chamber that is provided to communicate with the vacuum processing chamber; an intermediate conveyance chamber that is provided to communicate with the vacuum processing chamber; a first load lock chamber and a second load lock chamber that are respectively provided at positions at which the first load lock chamber and the second load lock chamber face each other with interposing the intermediate conveyance chamber and communicate with the intermediate conveyance chamber; an intermediate conveyance mechanism that is provided in the intermediate conveyance chamber and performs wafer conveyance between the vacuum processing chamber and the first load lock chamber via the intermediate conveyance chamber and wafer conveyance between the vacuum processing chamber and the second load lock chamber via the intermediate conveyance chamber; a first conveyance mechanism that is provided at a position at which the first conveyance mechanism faces the first load lock chamber, brings a wafer into the first load lock chamber, and takes out a wafer from the first load lock chamber; a second conveyance mechanism that is provided at a position at which the second conveyance mechanism faces the second load lock chamber, brings a wafer into the second load lock chamber, and takes out a wafer from the second load lock chamber; an alignment device that is provided at a position between the first conveyance mechanism and the second conveyance mechanism and configured to be able to adjust a rotation position of a wafer; a buffer device that is provided at a position between the first conveyance mechanism and the second conveyance mechanism and configured to be able to temporarily hold two or more wafers; and a load port that allows a wafer container in which a plurality of wafers that are targets of the ion implantation process are stored to be fixed at a position at which the wafer container faces the first conveyance mechanism, and wherein the first conveyance mechanism has a first arm capable of holding a wafer and a second arm capable of holding a wafer. In the ion implantation apparatus, the second conveyance mechanism has a third arm capable of holding a wafer and a fourth arm capable of holding a wafer. This processing method includes: (a) conveying a first wafer and a second wafer to the buffer device from the wafer container by the first arm and the second arm; (b) conveying the first wafer to the alignment device from the buffer device by the third arm, taking out the second wafer from the buffer device by the fourth arm, and holding the second wafer temporarily; (c) taking out the first wafer subjected to alignment from the alignment device by the third arm and bringing the second wafer into the alignment device by the fourth arm; (d) bringing the first wafer subjected to alignment into the second load lock chamber by the third arm; and (e) conveying the second wafer subjected to alignment to the first load lock chamber from the alignment device by the first arm.

According to still another aspect of the present invention, there is provided an ion implantation apparatus. This apparatus includes: a vacuum processing chamber in which an ion implantation process is performed; an intermediate conveyance chamber that is provided to communicate with the vacuum processing chamber; a first load lock chamber and a second load lock chamber that are respectively provided at positions at which the first load lock chamber and the second load lock chamber face each other with interposing the intermediate conveyance chamber and communicate with the intermediate conveyance chamber; an intermediate conveyance mechanism that is provided in the intermediate conveyance chamber and performs wafer conveyance between the vacuum processing chamber and the first load lock chamber via the intermediate conveyance chamber and wafer conveyance between the vacuum processing chamber and the second load lock chamber via the intermediate conveyance chamber; a first conveyance mechanism that is provided at a position at which the first conveyance mechanism faces the first load lock chamber, brings a wafer into the first load lock chamber, and takes out a wafer from the first load lock chamber; a second conveyance mechanism that is provided at a position at which the second conveyance mechanism faces the second load lock chamber, brings a wafer into the second load lock chamber, and takes out a wafer from the second load lock chamber; an alignment device that is provided at a position between the first conveyance mechanism and the second conveyance mechanism and configured to be able to adjust a rotation position of a wafer; a buffer device that is provided at a position between the first conveyance mechanism and the second conveyance mechanism and configured to be able to temporarily hold two or more wafers; and a load port that allows a wafer container in which a plurality of wafers that are targets of the ion implantation process are stored to be fixed at a position at which the wafer container faces the first conveyance mechanism. In the ion implantation apparatus, the first conveyance mechanism and the second conveyance mechanism convey a pair of two wafers not subjected to an alignment process to the alignment device from the wafer container via the buffer device and bring the wafers respectively into the first load lock chamber and the second load lock chamber after alignment, and the intermediate conveyance mechanism conveys one of the pair of two wafers subjected to alignment to the vacuum processing chamber from the second load lock chamber, and then conveys the one to the second load lock chamber from the vacuum processing chamber after an ion implantation process and conveys the other of the pair of two wafers subjected to alignment to the vacuum processing chamber from the first load lock chamber, and then conveys the other to the first load lock chamber from the vacuum processing chamber after anion implantation process. In addition, the first conveyance mechanism and the second conveyance mechanism take out the pair of two wafers subjected to an implantation process respectively from the first load lock chamber and the second load lock chamber and store the wafers into the wafer container.

Optional combinations of the aforementioned constituting elements, and implementations of the invention in the form of methods, apparatuses, and systems, may also be practiced as additional modes of the present invention.

DETAILED DESCRIPTION OF THE INVENTION

Figure 1:
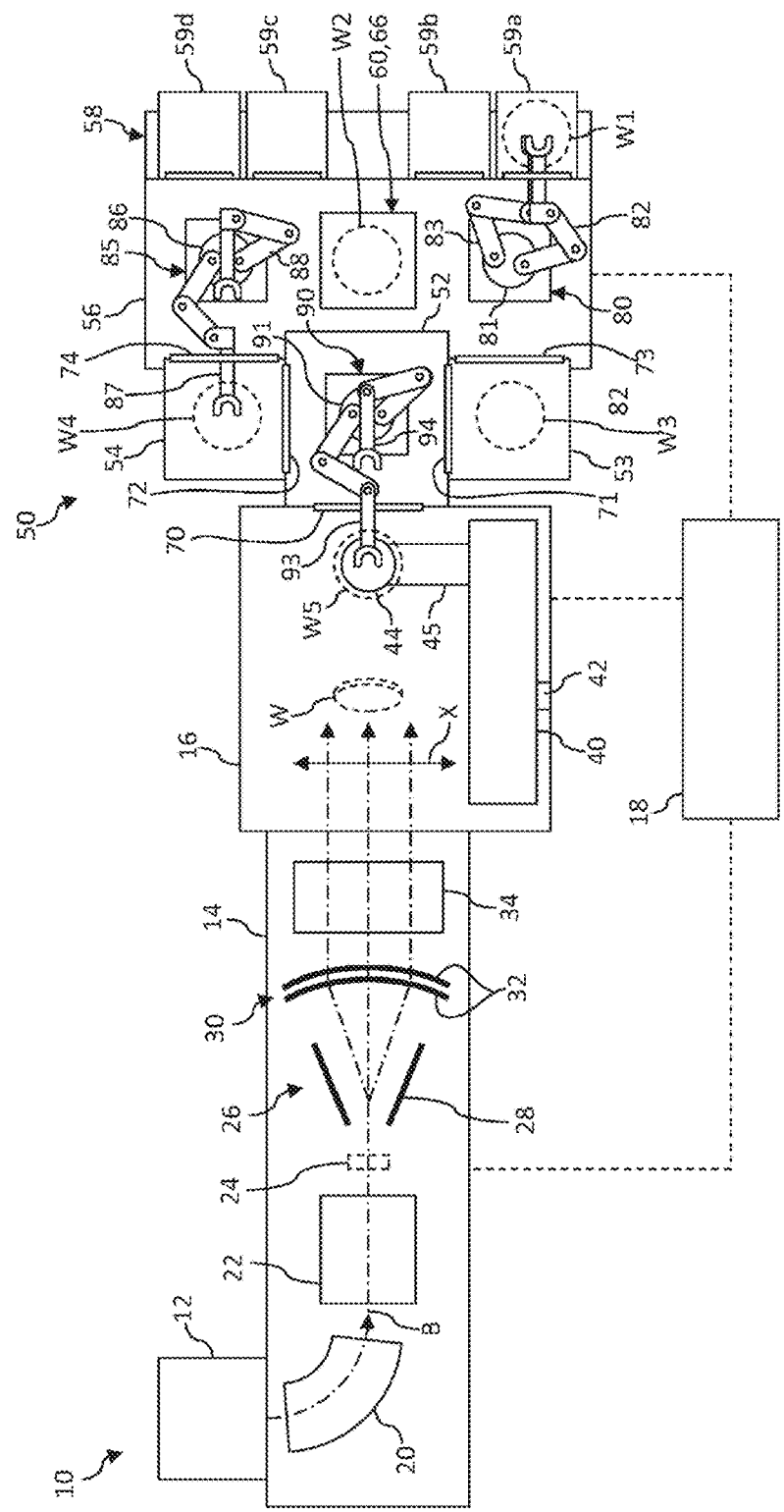
FIG. 1 is a top view that illustrates a schematic configuration of an ion implantation apparatus according to an embodiment.

The invention will now be described by reference to the preferred embodiments. This does not intend to limit the scope of the present invention, but to exemplify the invention.

Hereinafter, embodiments of the present invention will be described in detail with reference to the drawings. In description of the drawings, the same reference numeral is assigned to the same element, and duplicate description thereof will not be presented as is appropriate. The configuration described below is merely an example but does not limit the scope of the present invention.

Figure 2:
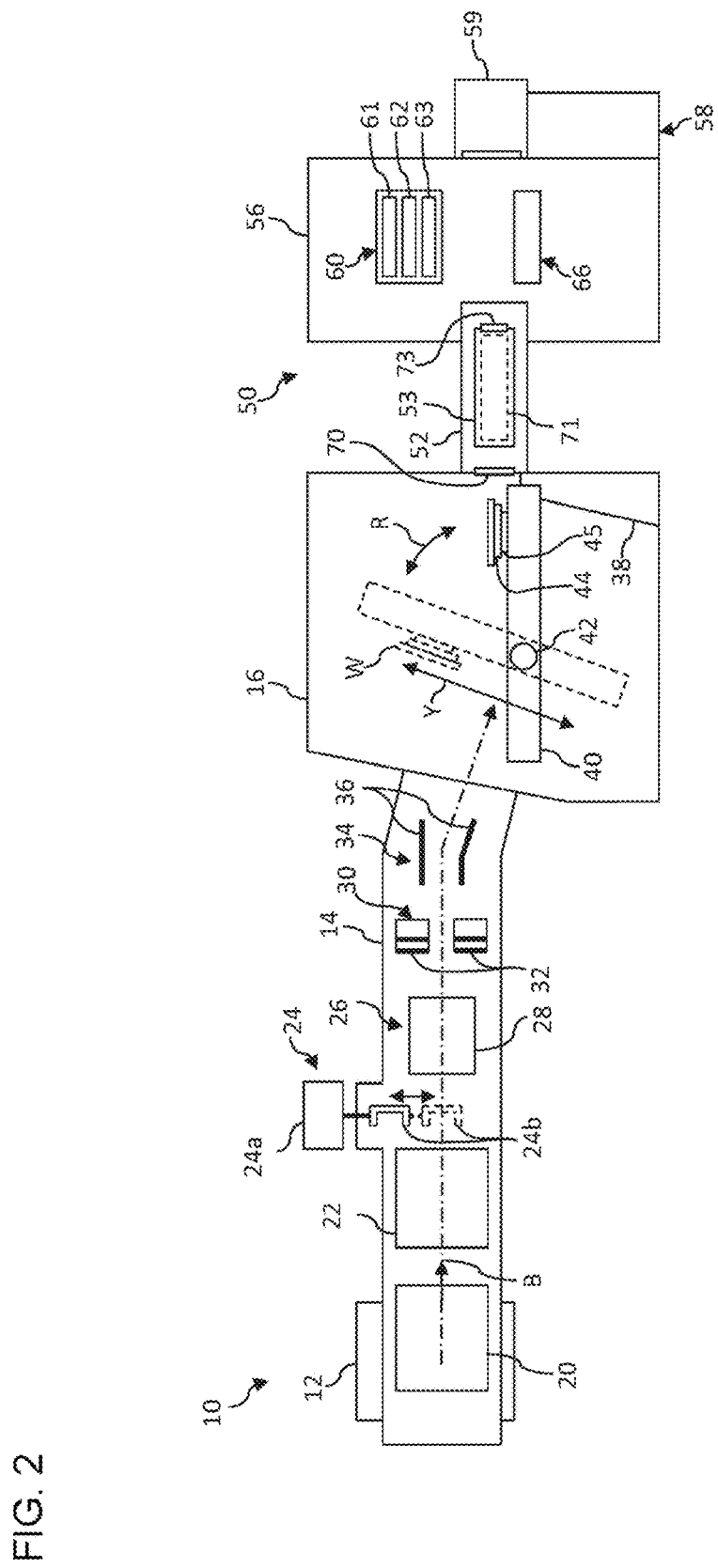
FIG. 2 is a side view that illustrates a schematic configuration of an ion implantation apparatus according to an embodiment.

FIG. 1 is a top view that illustrates a schematic configuration of an ion implantation apparatus 10 according to an embodiment, and FIG. 2 is a side view that illustrates a schematic configuration of the ion implantation apparatus 10 according to an embodiment.

The ion implantation apparatus 10 is configured to perform an ion implantation process for the surface of a processed object W. The processing object W, for example, is a substrate or, for example, is a semiconductor wafer. Hereinafter, while the processing object W may be referred to as a wafer W for the convenience of description, this is not intended to limit the target for the implantation process to a specific object.

An ion implantation apparatus 10 is configured to radiate an ion beam B over the entirety of a wafer W by causing the beam to reciprocally scan in one direction and causing the wafer W to reciprocally move in a direction perpendicular to the one direction. In this description, for the convenience of explanation, a traveling direction of the ion beam B which advances a designed beam orbit is defined as a direction z and a plane perpendicular to the direction z is defined as a plane xy. In a case where the ion beam B is scanned for the processing object W, the scanning direction of the beam is set as a direction x, and a direction perpendicular to the direction z and the direction x is set as a direction y. Accordingly, the reciprocative scanning of the beam is performed in the direction x, and the reciprocative movement of the wafer W is performed in the direction y.

The ion implantation apparatus 10 includes: an ion source 12; a beamline device 14; a vacuum processing chamber 16; a controller 18; and a wafer conveyance device 50. The ion source 12 is configured to supply the ion beam B to the beamline device 14. The beamline device 14 is configured to transport ions from the ion source 12 to the vacuum processing chamber 16. The ion implantation apparatus 10 includes an evacuation system that is used for providing a desired vacuum environment for the ion source 12, the beamline device 14, and the vacuum processing chamber 16.

The beamline device 14, for example, includes: a mass analyzing unit 20; a beam focusing unit 22; a beam measurement unit 24; a beam scanner 26; a parallelizing lens 30 or a beam collimating device; and an angular energy filter (AEF) 34 in order from the upstream side. Here, the upstream side of the beamline device 14 represents a side close to the ion source 12, and the downstream side of the beamline device 14 represents a side close to the vacuum processing chamber 16 (or a beam stopper 38).

The mass analysis unit 20 is disposed at the downstream side of the ion source 12 and is configured to select a necessary ion species from an ion beam B extracted from the ion source 12 by a mass analysis. The beam converging unit 22 includes a focusing lens such as a quadrupole focusing device (Q lens) and is configured to shape the ion beam B passing through the mass analysis unit 20 into a desired cross-sectional shape by focusing the ion beam.

The beam measurement unit 24 is an injector flag Faraday cup that is disposed so as to move in or out on the beamline and measures the current of the ion beam. The beam measurement unit 24 includes: a faraday cup 24b that measures a beam current and a drive unit 24a that moves the faraday cup 24b up and down. As indicated by a dashed line in FIG. 2, in a case where the faraday cup 24b is arranged on a beamline, the ion beam B is blocked by the faraday cup 24b. On the other hand, as indicated by a solid line in FIG. 2, in a case where the faraday cup 24b is taken off from the beamline, the blocking of the ion beam B is cancelled.

The beam scanner 26 is configured to provide reciprocative scanning of the beam and is a deflection member that scans the shaped ion beam B in the direction x. The beam scanner 26 includes a pair of scanner electrodes 28 that are disposed to face each other in the direction x. A pair of the scanner electrodes 28 are connected to a variable voltage power supply (not illustrated in the drawings). A voltage that is applied to the pair of the scanner electrodes 28 is periodically changed, in such a manner that an electric field generated between the electrodes is changed so as to deflect the ion beam B at various angles. In this way, the ion beam B is scanned over the scan range extracting in the direction x. In FIG. 1, the scanning direction and the scan range of the ion beam are illustrated by an arrow X as an example, and a plurality of trajectories of the ion beam B in the scan range are denoted by chain lines.

A collimating lens 30 is configured to parallelize traveling directions of the ion beam B subjected to scanning such that the traveling direction are parallel to the beam orbit. The collimating lens 30 includes a plurality of P-lens electrodes 32 each having an arc shape that has a passage slit of the ion beam B at the center portion. Each P-lens electrode 32 is connected to a high-voltage power supply (not illustrated in the figure) and allows the traveling directions of the ion beam B to be parallel by applying the electric field generated by the application of the voltage to the ion beam B.

The angular energy filter (AEF) 34 is configured to analyze the energy of the ion beam B, deflect the ion having a necessary energy downward at an appropriate angle, and lead the ion to the vacuum processing chamber 16. The angular energy filter 34 includes a pair of AEF electrodes 36 used for deflection by an electric field, and the pair of AEF electrodes 36 are connected to a high-voltage power supply (not illustrated in the figure). In FIG. 2, a positive voltage is applied to an upper AEF electrode and a negative voltage is applied to a lower AEF electrode, in such a manner that the ion beam B is deflected downward from the beam orbit. Here, the angular energy filter 34 may be configured by a magnetic device used for deflection by a magnetic field or may be configured by a combination of a pair of AEF electrodes used for deflection by an electric field and a magnetic device used for deflection by a magnetic field.

In this way, the beamline device 14 supplies the ion beam B to be irradiated on the wafer W to the vacuum processing chamber 16.

The vacuum processing chamber 16 includes a wafer holder 44 that holds one or a plurality of wafers W. A wafer holder 44 is attached to, through an arm portion 45, a moving mechanism 40 that can linearly move the wafer holder 44 as is necessary. The wafer holder 44 includes, for example, an electrostatic chuck for holding the wafer W. The moving mechanism 40 is configured to be rotatable in a direction indicated by an arrow R illustrated in FIG. 2 around a rotation shaft 42 at its center and is configured to be able to be displaced between a conveyance position (illustrated using solid lines) used for placing the wafer W5 on the wafer holder 44 and an implantation position (illustrated using dashed lines) used for implanting ions into the wafer W. The moving mechanism 40 causes the wafer holder 44 to reciprocate so as to provide relative movement (for example, in the direction y) with respect to the ion beam B for the wafer W as is necessary when the ions are implanted. In FIG. 2, a reciprocating motion of the wafer W is illustrated using an arrow Y.

The vacuum processing chamber 16 includes a beam stopper 38. In a case where the wafer W is not present in the beam trajectory, the ion beam B is incident into the beam stopper 38. In addition, a first evacuation device (not illustrated in the drawings) is connected to the vacuum processing chamber 16. In a steady state in which wafer processing is not performed, the first evacuation device is an evacuation device that realizes a high vacuum state of $10^{-3}$ Pa or less, for example, and is configured by a cryopump or the like.

A wafer conveyance device 50 includes: an intermediate conveyance chamber 52; a first load lock chamber 53; a second load lock chamber 54; an atmosphere conveyance unit 56; and a load port 58. The wafer conveyance device 50 is configured to convey wafers that are stored in a wafer container 59 (59a to 59d) installed in the load port 58 to the vacuum processing chamber 16. The wafers, for example, as wafers W1 to W5 illustrated in FIG. 1, are brought into the vacuum processing chamber 16 from the wafer container 59 through the atmosphere conveyance unit 56, the first load lock chamber 53 or the second load lock chamber 54, and the intermediate conveyance chamber 52. Meanwhile, the wafer W for which the ion implantation process has been performed is stored into the wafer container 59 through the intermediate conveyance chamber 52, the first load lock chamber 53 or the second load lock chamber 54, and the atmosphere conveyance unit 56.

A second evacuation device (not illustrated in the drawings) that is configured by a turbo molecular pump or the like is connected to the intermediate conveyance chamber 52. In a steady state in which wafer processing is not performed, the intermediate conveyance chamber 52 is maintained to be in a middle to high vacuum state of about $10^{-1}$ Pa. The atmosphere conveyance unit 56 is kept under the atmospheric pressure and conveys a wafer in the atmosphere. The first load lock chamber 53 and the second load lock chamber 54 are chambers that are partitioned for realizing the conveyance of a wafer between the intermediate conveyance chamber 52 that is maintained in the vacuum state and the atmosphere conveyance unit 56 that is under the atmospheric pressure. A third evacuation device (not illustrated in the drawings) is connected to the first load lock chamber 53 and the second load lock chamber 54. The first load lock chamber 53 and the second load lock chamber 54 are configured to be able to perform vacuum evacuating (vacuuming) and releasing (venting) to the atmosphere when the wafer is conveyed. The third evacuation device is configured by, for example, a roughing vacuum pump, such as an oil-sealed rotary vacuum pump and a dry vacuum pump.

The wafer conveyance device 50 is disposed to be adjacent to the vacuum processing chamber 16 in a direction in which the beamline device 14 extends. The intermediate conveyance chamber 52 is disposed to be adjacent to the vacuum processing chamber 16 in the direction in which the beamline device 14 extends. Furthermore, the intermediate conveyance chamber 52 is disposed to be adjacent to the vacuum processing chamber 16, the first load lock chamber 53, and the second load lock chamber 54. An intermediate conveyance chamber-vacuum processing chamber communicate mechanism 70 for conveying the wafer is provided in a portion between the intermediate conveyance chamber 52 and the vacuum processing chamber 16. A communication port that allows the intermediate conveyance chamber 52 and the vacuum processing chamber 16 to be connected to each other and a gate valve for closing the communication port are provided in the intermediate conveyance chamber-vacuum processing chamber communicate mechanism 70. When the wafer is conveyed between the vacuum processing chamber 16 and the intermediate conveyance chamber 52, the gate valve of the intermediate conveyance chamber-vacuum processing chamber communicate mechanism 70 is open. When the ion implantation process is performed in the vacuum processing chamber 16, the gate valve of the intermediate conveyance chamber-vacuum processing chamber communicate mechanism 70 is closed.

The first load lock chamber 53 and the second load lock chamber 54 are provided to be adjacent to the intermediate conveyance chamber 52 in a direction perpendicular to the direction in which the beamline device 14 extends. The first load lock chamber 53 and the second load lock chamber 54 are respectively disposed at positions at which the first load lock chamber 53 and the second load lock chamber 54 face each other with interposing the intermediate conveyance chamber 52. In the sheet of FIG. 1, for example, the vacuum processing chamber 16 and the intermediate conveyance chamber 52 are disposed to be adjacent in a right-left direction in which the beamline device 14, and further, the intermediate conveyance chamber 52, the first load lock chamber 53, and the second load lock chamber 54 are disposed to be adjacent in an up-down direction perpendicular to the right-left direction. Two load lock chamber is provided, and thus, when a plurality of wafers are conveyed, two wafers can be conveyed in parallel.

The first load lock chamber 53 has a first load lock chamber-intermediate conveyance chamber communicate mechanism 71 that is provided in a portion between the first load lock chamber 53 and the intermediate conveyance chamber 52 and a first load lock chamber-atmosphere conveyance unit communicate mechanism 73 that is provided in a portion between the first load lock chamber 53 and the atmosphere conveyance unit 56. Gate valves that allow the first load lock chamber 53 to be an enclosed space are respectively provided in the first load lock chamber-intermediate conveyance chamber communicate mechanism 71 and the first load lock chamber-atmosphere conveyance unit communicate mechanism 73. The second load lock chamber 54 has a second load lock chamber-intermediate conveyance chamber communicate mechanism 72 that is provided in a portion between the second load lock chamber 54 and the intermediate conveyance chamber 52 and a second load lock chamber-atmosphere conveyance unit communicate mechanism 74 that is provided in a portion between the second load lock chamber 54 and the atmosphere conveyance unit 56. Gate valves that allow the second load lock chamber 54 to be an enclosed space are respectively provided in the second load lock chamber-intermediate conveyance chamber communicate mechanism 72 and the second load lock chamber-atmosphere conveyance unit communicate mechanism 74.

When the first load lock chamber 53 is vacuum-evacuated or released to the atmosphere, the gate valves of the first load lock chamber-intermediate conveyance chamber communicate mechanism 71 and the first load lock chamber-atmosphere conveyance unit communicate mechanism 73 are closed. When the wafer is conveyed between the intermediate conveyance chamber 52 and the first load lock chamber 53, the gate valve that is provided in the first load lock chamber-intermediate conveyance chamber communicate mechanism 71 is open and the gate valve that is provided in the first load lock chamber-atmosphere conveyance unit communicate mechanism 73 is closed. When the wafer is conveyed between the atmosphere conveyance unit 56 and the first load lock chamber 53, the gate valve that is provided in the first load lock chamber-atmosphere conveyance unit communicate mechanism 73 is open and the gate valve that is provided in the first load lock chamber-intermediate conveyance chamber communicate mechanism 71 is closed.

Similarly, when the second load lock chamber 54 is vacuum-evacuated or released to the atmosphere, the gate valves of the second load lock chamber-intermediate conveyance chamber communicate mechanism 72 and the second load lock chamber-atmosphere conveyance unit communicate mechanism 74 are closed. When the wafer is conveyed between the intermediate conveyance chamber 52 and the second load lock chamber 54, the gate valve that is provided in the second load lock chamber-intermediate conveyance chamber communicate mechanism 72 is open and the gate valve that is provided in the second load lock chamber-atmosphere conveyance unit communicate mechanism 74 is closed. When the wafer is conveyed between the atmosphere conveyance unit 56 and the second load lock chamber 54, the gate valve that is provided in the second load lock chamber-atmosphere conveyance unit communicate mechanism 74 is open and the gate valve that is provided in the second load lock chamber-intermediate conveyance chamber communicate mechanism 72 is closed.

The load port 58 is disposed to be adjacent to the atmosphere conveyance unit 56. The load port 58 is disposed at a position at which the load port 58 faces the intermediate conveyance chamber 52, the first load lock chamber 53, and second load lock chamber 54 with the atmosphere conveyance unit 56 interposed therebetween. The load port 58 is provided to extend in parallel with the first load lock chamber 53, the intermediate conveyance chamber 52, and the second load lock chamber 54. The load port 58 is configured to enable all of the plurality of wafer containers 59a to 59d to be installed in the load port 58. In this embodiment, installation positions of the first container 59a and the second container 59b are set to be close to a first conveyance mechanism 80 and installation positions of the third container 59c and the fourth container 59d are set to be close to a second conveyance mechanism 85. In a modified example, the load port may be a load port that enables a different number of wafer containers to be installed therein or a load port that enables a wafer container to be installed therein.

The atmosphere conveyance unit 56 has a buffer device 60, an alignment device 66, the first conveyance mechanism 80, and the second conveyance mechanism 85. For the clarity of explanation, the first conveyance mechanism 80 and the second conveyance mechanism 85 are not illustrated in FIG. 2.

The buffer device 60 is a device that temporarily holds a wafer which is taken out from the wafer container 59 and not subjected to the implantation process, a wafer which is taken out from the load lock chamber and subjected to the implantation process, and the like in the atmosphere conveyance unit 56. The buffer device 60 is configured to be able to hold three wafers in total. The buffer device 60 has a first buffer 61, a second buffer 62, and a third buffer 63 that are aligned in a vertical direction, as illustrated in FIG. 2. The first buffer 61, the second buffer 62, and the third buffer 63 are configured such that each buffer can accommodate a wafer. The buffer device 60 is disposed at a position between the first conveyance mechanism 80 and the second conveyance mechanism 85.

The alignment device 66 is a device that adjusts a center position or a rotation position of the wafer. The alignment device 66 is configured to be able to accommodate a wafer. The alignment device 66 detects an alignment mark, such as a notch, on an accommodated wafer and adjusts the center position or rotation position of the wafer such that the center position or the rotation position is set to a desired position. The center position or the rotation position of the wafer that is taken out from the wafer container 59 is not always aligned, and thus positioning (aligning) is performed on the wafer using the alignment device 66 before the wafer is brought into the load lock chamber. The alignment device 66 is disposed at a position between the first conveyance mechanism 80 and the second conveyance mechanism 85. Furthermore, the alignment device 66 is disposed at a position at which the alignment device 66 and the buffer device 60 overlap in the vertical direction. The alignment device 66 is disposed at a position below the buffer device 60 in the vertical direction, as illustrated in FIG. 2.

The first conveyance mechanism 80 and the second conveyance mechanism 85 are respectively disposed at positions at which the first conveyance mechanism 80 and the second conveyance mechanism 85 face each other with interposing the buffer device 60 and the alignment device 66. The first conveyance mechanism 80 is disposed at the position at which the first conveyance mechanism 80 faces the first load lock chamber 53. The first conveyance mechanism 80 brings the wafer into the first load lock chamber 53 and takes out the wafer from the first load lock chamber 53. The first conveyance mechanism 80 is disposed at a position at which the first conveyance mechanism 80 faces the first container 59a and the second container 59b that are fixed to the load port 58. The first conveyance mechanism 80 takes out the wafers from the first container 59a and the second container 59b and stores the wafers into the first container 59a and the second container 59b. In addition, the first conveyance mechanism 80 brings the wafers into the buffer device 60 and the alignment device 66 and takes out the wafers from the buffer device 60 and the alignment device 66.

The second conveyance mechanism 85 is disposed at a position at which the second conveyance mechanism 85 faces the second load lock chamber 54. The second conveyance mechanism 85 brings the wafer into the second load lock chamber 54 and takes out the wafer from the second load lock chamber 54. The second conveyance mechanism 85 is disposed at a position at which the second conveyance mechanism 85 faces the third container 59c and the fourth container 59d that are fixed to the load port 58. The second conveyance mechanism 85 takes the wafers from the third container 59c and the fourth container 59d and stores the wafers into the third container 59c and the fourth container 59d. In addition, the second conveyance mechanism 85 brings the wafers into the buffer device 60 and the alignment device 66 and takes out the wafers from the buffer device 60 and the alignment device 66.

Figure 3:
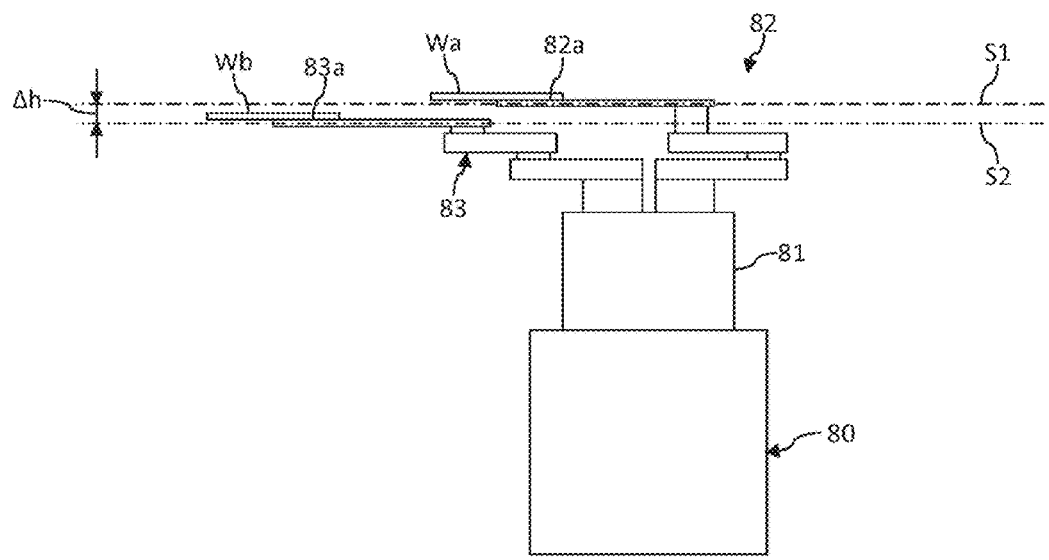
FIG. 3 is a side view that illustrates a schematic configuration of a first conveyance mechanism.

FIG. 3 is a side view that illustrates a schematic configuration of the first conveyance mechanism 80. The first conveyance mechanism 80 has a first conveyance main body portion 81, a first arm 82, and a second arm 83. The first arm 82 and the second arm 83 are attached to the first conveyance main body portion 81. The first arm 82 and the second arm 83 can perform an extension/retraction operation in relation to the first conveyance main body portion 81. The first conveyance main body portion 81 can perform a raising/lowering operation in the vertical direction (which is an h direction) and a turning operation with respect to a center axis in the vertical direction. The first conveyance main body portion 81 performs the raising/lowering operation, in such a manner that the first conveyance main body portion 81 adjusts positions of the first arm 82 and the second arm 83 in the vertical direction. In addition, the first conveyance main body portion 81 performs the turning operation, in such a manner that the first conveyance main body portion 81 changes an extension/retraction direction of the first arm 82 and the second arm 83.

Each of the first arm 82 and the second arm 83 is a so-called robotic arm. Each of the first arm 82 and the second arm 83 is configured to be able to hold a wafer and move the held wafer in a horizontal direction. A first wafer holder 82a of the first arm 82 is configured to be able to move in a first horizontal plane S1. A second wafer holder 83a of the second arm 83 is configured to be able to move in a second horizontal plane S2 that is located vertically below the first horizontal plane S1. A gap $\Delta h$ between the first horizontal plane S1 and the second horizontal plane S2 in the vertical direction is set to be the same as a gap between the wafers that are stored in the wafer container 59 in a state where the wafers are aligned in the vertical direction. Thus, the value of the gap $\Delta h$ is set to be a constant value always, regardless of the raising/lowering operation of the first conveyance main body portion 81.

The second conveyance mechanism 85 has a second conveyance main body portion 86, a third arm 87, and a fourth arm 88. The second conveyance mechanism 85 is configured to be similar to, for example, the first conveyance mechanism 80 that is illustrated in FIG. 3. A wafer holder of the third arm 87 is configured to be able to move in the horizontal direction in a third horizontal plane. A wafer holder of the fourth arm 88 is configured to be able to move in the horizontal direction in a fourth horizontal plane that is located vertically below the third horizontal plane. The third arm 87 and the fourth arm 88 are attached to the second conveyance main body portion 86. The third arm 87 and the fourth arm 88 can perform an extension/retraction operation in relation to the second conveyance main body portion 86. The second conveyance main body portion 86 can perform a raising/lowering operation and a turning operation. The second conveyance main body portion 86 changes vertical positions of the wafer holders of the third arm 87 and the fourth arm 88 and an extension/retraction direction of the arm.

An intermediate conveyance mechanism 90 is provided in the intermediate conveyance chamber 52. The intermediate conveyance mechanism 90 performs conveyance of the wafer between the vacuum processing chamber 16 and the intermediate conveyance chamber 52, conveyance of the wafer between the intermediate conveyance chamber 52 and the first load lock chamber 53, and conveyance of the wafer between the intermediate conveyance chamber 52 and the second load lock chamber 54.

The intermediate conveyance mechanism 90 has an intermediate conveyance main body portion 91, a fifth arm 92, and a sixth arm 93. The intermediate conveyance mechanism 90 is configured to be similar to the first conveyance mechanism 80 or the second conveyance mechanism 85. A wafer holder of the fifth arm 92 is configured to be able to move in the horizontal direction in a fifth horizontal plane. A wafer holder of the sixth arm 93 is configured to be able to move in the horizontal direction in a sixth horizontal plane that is located vertically below the fifth horizontal plane. The fifth arm 92 and the sixth arm 93 are attached to the intermediate conveyance main body portion 91. The arms can be extended or retracted in relation to the intermediate conveyance main body portion 91. The intermediate conveyance main body portion 91 can perform a raising/lowering operation and a turning operation. The intermediate conveyance main body portion 91 changes vertical positions of the wafer holders of the fifth arm 92 and the sixth arm 93 and an extension/retraction direction of the arm.

In the wafer conveyance device 50, configuration devices are line-symmetrically arranged with respect to a center line that connects the vacuum processing chamber 16, the intermediate conveyance chamber 52, the buffer device 60, and the alignment device 66. Specifically, the first load lock chamber 53 and the second load lock chamber 54 are line-symmetrically arranged, the first conveyance mechanism 80 and the second conveyance mechanism 85 are line-symmetrically arranged, and a pair of the first container 59a and the second container 59b and a pair of the third container 59c and the fourth container 59d are line-symmetrically arranged.

A controller 18 controls operations of respective devices constituting the ion implantation apparatus 10. The controller 18 controls an operation of the convey mechanism and the communicate mechanism that is provided in the wafer conveyance device 50, in such a manner that the controller 18 realizes an operation of bringing the wafer into the vacuum processing chamber 16 from the wafer container 59 and an operation of taking out the wafer from the vacuum processing chamber 16 to the wafer container 59.

Figure 4:
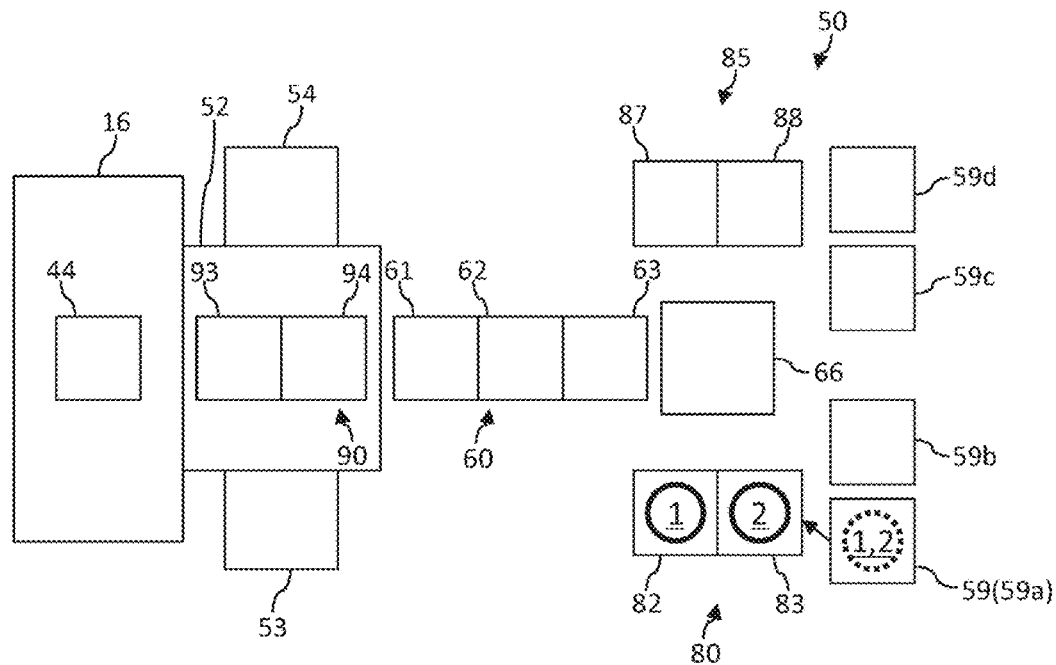
FIG. 4 is a schematic diagram that illustrates processes for conveying wafers.

Next, a flow of the wafer conveyance of the ion implantation apparatus 10 will be described. FIG. 4 is a schematic diagram that illustrates a state of the wafer conveyance. In FIG. 4, a place in which the wafer can be temporarily held in the wafer conveyance device 50 is indicated by a square frame. Specifically, illustrated as positions in which the wafers are temporarily held are the wafer holder 44 of the vacuum processing chamber 16, the first load lock chamber 53, the second load lock chamber 54, the wafer container 59, the first buffer 61, the second buffer 62, and the third buffer 63 of the buffer device 60, the alignment device 66, the first arm 82 and the second arm 83 of the first conveyance mechanism 80, the third arm 87 and the fourth arm 88 of the second conveyance mechanism 85, and the fifth arm 92 and the sixth arm 93 of the intermediate conveyance mechanism 90. The first buffer 61, the second buffer 62, the third buffer 63, and the alignment device 66 are disposed to be aligned in the vertical direction, as illustrated in FIG. 2. However, in FIG. 4, for the convenience of explanation, the first buffer 61, the second buffer 62, the third buffer 63, and the alignment device 66 are disposed to be aligned in the right-left direction. In addition, the wafer subjected to conveyance is indicated by a circle and a reference numeral for identifying a wafer is illustrated inside the circle. Particularly, a wafer that is held after conveyance is indicated by a circle of a solid line and a wafer that is held before conveyance is indicated by a circle of a dashed line. Those are also applied to the subsequent drawings following FIG. 5.

First, the first conveyance mechanism 80 simultaneously takes out a first wafer 1 and a second wafer 2 from the wafer container 59 (which is the first container 59a, specifically), as illustrated in FIG. 4. The first wafer 1 is taken out by the first arm 82 that is an upper arm and the second wafer 2 is taken out by the second arm 83 that is a lower arm. The first arm 82 and the second arm 83 of which positions deviate from each other in the vertical direction are simultaneously inserted into the wafer container 59, in such a manner that two wafers are simultaneously taken out from the wafer container 59 in which a plurality of wafers are stored in a state where the wafers are aligned in the vertical direction.

Figure 5:
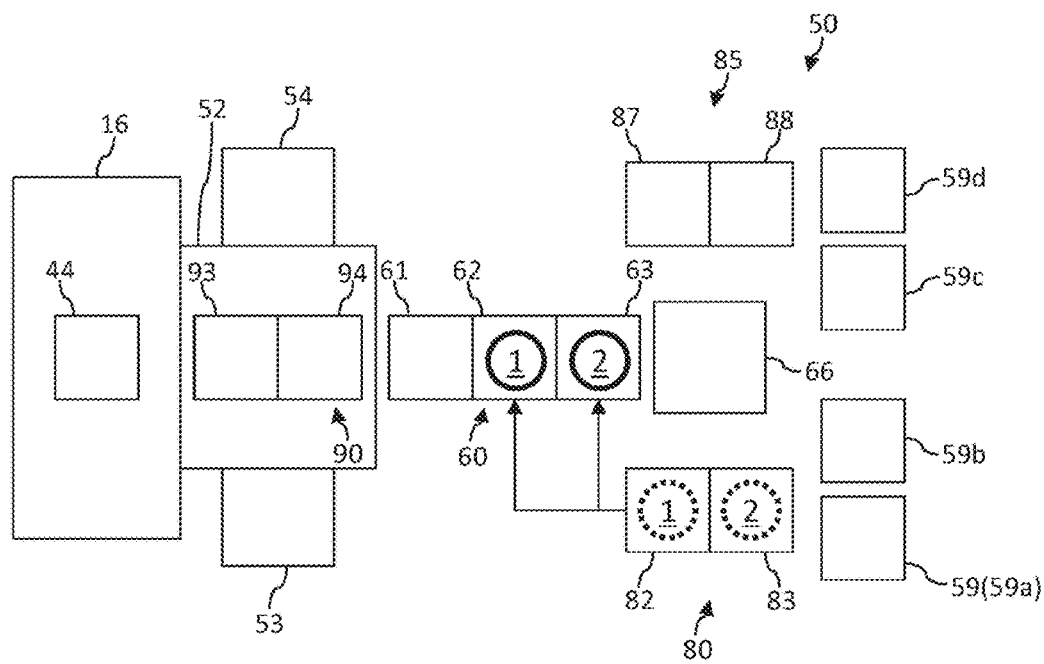
FIG. 5 is a schematic diagram that illustrates the processes for conveying wafers.

Next, the first conveyance mechanism 80 simultaneously brings the first wafer 1 and the second wafer 2 into the buffer device 60, as illustrated in FIG. 5. The first wafer 1 is brought into the second buffer 62 by the first arm 82 that is an upper arm and the second wafer 2 is brought into the third buffer 63 by the second arm 83 that is a lower arm. Since the second buffer 62 and the third buffer 63 are aligned in the vertical direction, the two wafers can be simultaneously stored into the second buffer 62 and the third buffer 63 using the first arm 82 and the second arm 83.

Figure 6:
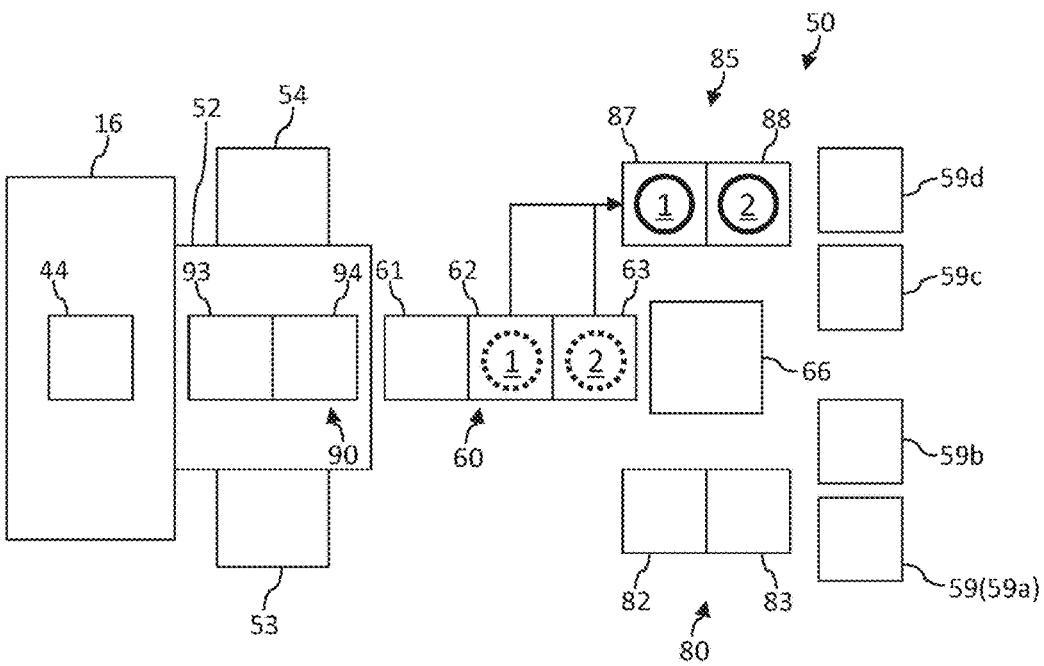
FIG. 6 is a schematic diagram that illustrates the processes for conveying wafers.

Subsequently, the second conveyance mechanism 85 simultaneously takes out the first wafer 1 and the second wafer 2 from the buffer device 60, as illustrated in FIG. 6. The first wafer 1 is taken out from the second buffer 62 by the third arm 87 that is an upper arm and the second wafer 2 is taken out from the third buffer 63 by the fourth arm 88 that is a lower arm. The third arm 87 and the fourth arm 88 of which positions deviate from each other in the vertical direction are simultaneously inserted into the buffer device 60, in such a manner that two wafers are simultaneously taken out from the second buffer 62 and the third buffer 63 that are aligned in the vertical direction.

Figure 7:
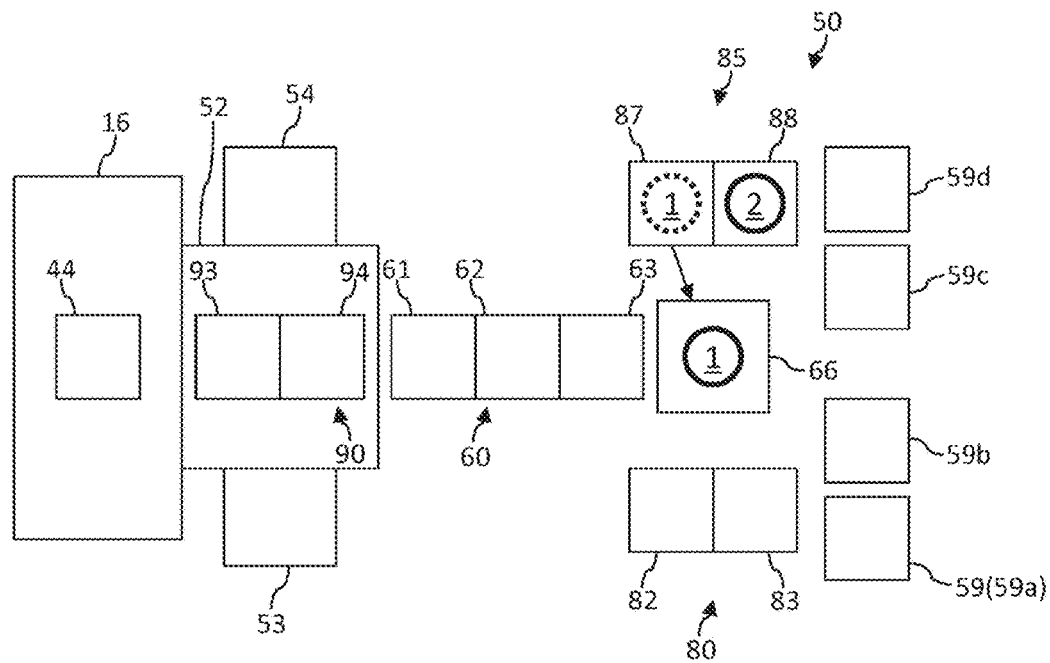
FIG. 7 is a schematic diagram that illustrates the processes for conveying wafers.

Next, the third arm 87 of the second conveyance mechanism 85 brings the first wafer 1 into the alignment device 66, as illustrated in FIG. 7. Furthermore, the fourth arm 88 still holds the second wafer 2 temporarily. Since the alignment device 66 is positioned vertically below the buffer device 60, the first wafer 1 can be conveyed from the second buffer 62 to the alignment device 66 by raising or lowering the second conveyance main body portion 86 without turning the second conveyance main body portion 86. Adjustment of a center position or a rotation position by the alignment device 66 is performed on the first wafer 1 that is brought into the alignment device 66.

Figure 8:
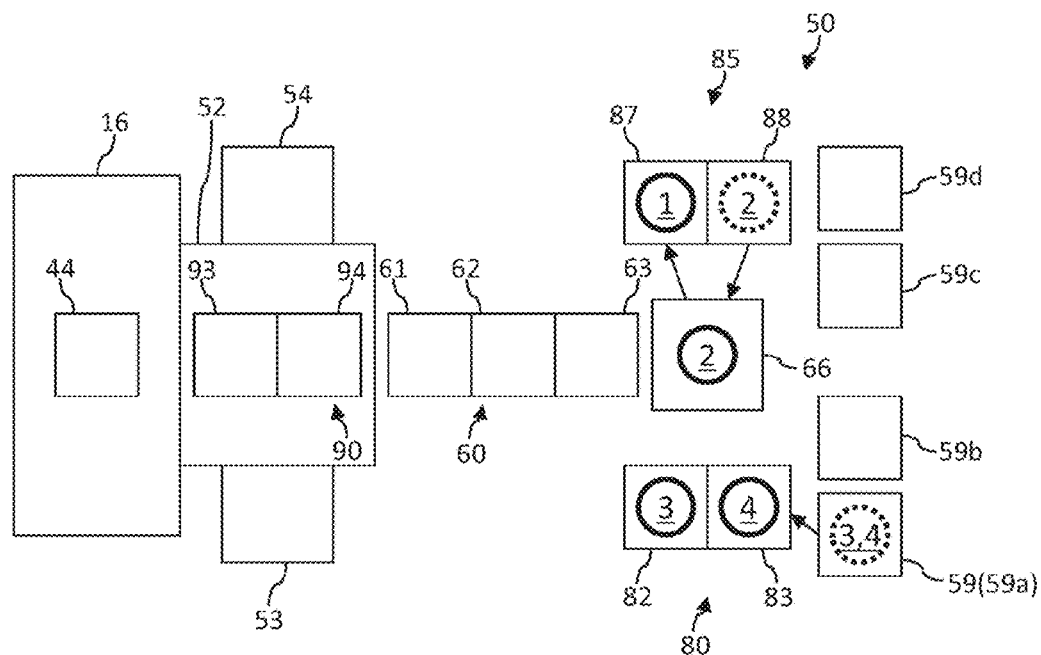
FIG. 8 is a schematic diagram that illustrates the processes for conveying wafers.

Subsequently, the third arm 87 of the second conveyance mechanism 85 takes out the first wafer 1 from the alignment device 66 and the fourth arm 88 brings the second wafer 2 into the alignment device 66, as illustrated in FIG. 8. The second conveyance mechanism 85 simultaneously performs an operation in which the third arm 87 is retracted for taking out the first wafer 1 subjected to alignment from the alignment device 66 and an operation in which the fourth arm 88 is extended for bring the second wafer 2 into the alignment device 66, in such a manner that a period required for exchanging the first wafer 1 and the second wafer 2 is reduced. In this case, the first wafer 1 and the second wafer 2 are conveyed such that the first wafer 1 and the second wafer 2 pass by each other at a position between the alignment device 66 and the second conveyance mechanism 85. Such an operation in which the wafers pass by each other is also called a "swapping operation".

Furthermore, during a period where the second conveyance mechanism 85 handles the first wafer 1 and the second wafer 2, the first conveyance mechanism 80 simultaneously takes out a third wafer 3 and a fourth wafer 4 from the wafer container 59. The third wafer 3 is taken out by the first arm 82 that is an upper arm and the fourth wafer 4 is taken out by the second arm 83 that is a lower arm, similar to processes of FIG. 4.

Figure 9:
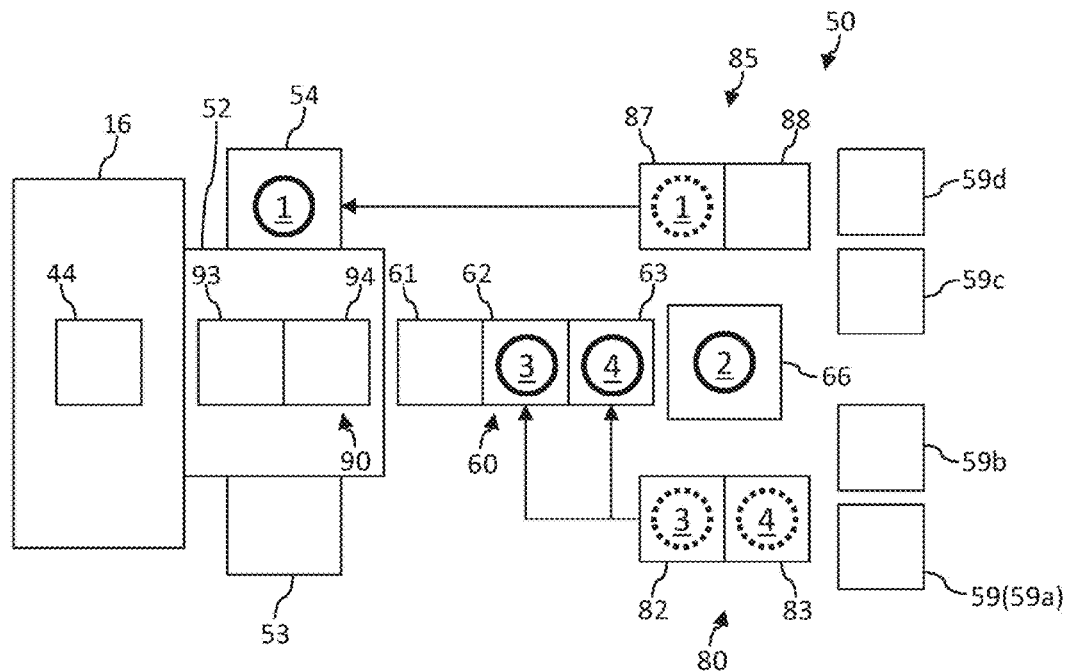
FIG. 9 is a schematic diagram that illustrates the processes for conveying wafers.

Next, the first conveyance mechanism 80 simultaneously brings the third wafer 3 and fourth wafer 4 into the buffer device 60, as illustrated in FIG. 9. The third wafer 3 is brought into the second buffer 62 by the first arm 82 that is the upper arm and the fourth wafer 4 is brought into the third buffer 63 by the second arm 83 that is the lower arm, similar to processes of FIG. 5. In addition, during a period where the first conveyance mechanism 80 handles the third wafer 3 and the fourth wafer 4, the third arm 87 of the second conveyance mechanism 85 brings the first wafer 1 subjected to alignment into the second load lock chamber 54. Furthermore, the center position or the rotation position of the second wafer 2 is adjusted in the alignment device 66.

Figure 10:
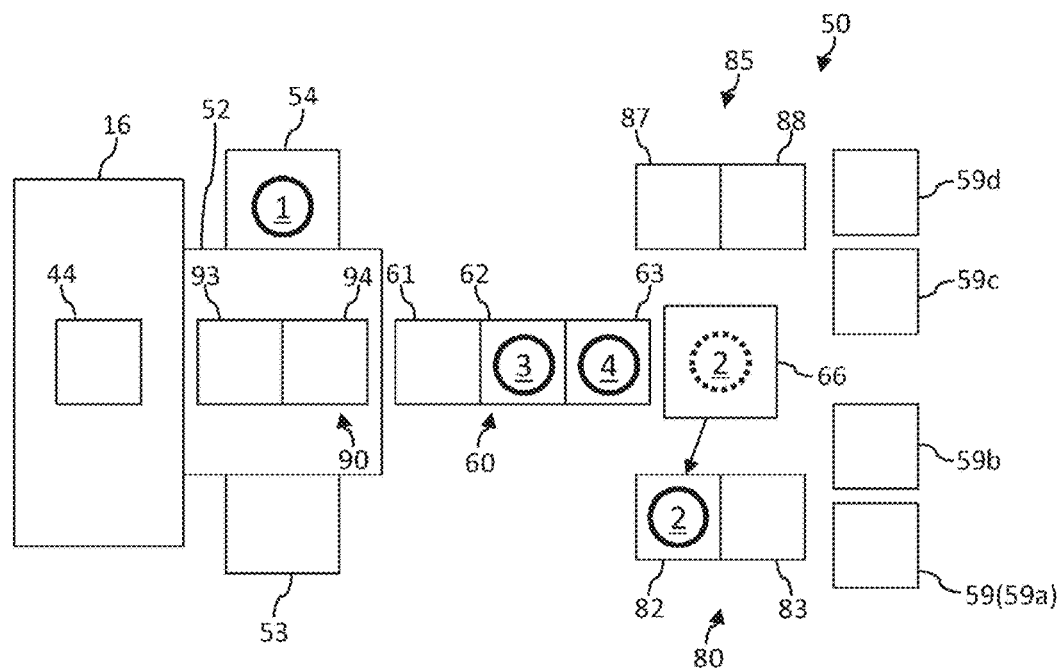
FIG. 10 is a schematic diagram that illustrates the processes for conveying wafers.

Then, the first arm 82 of the first conveyance mechanism 80 takes out the second wafer 2 subjected to alignment from the alignment device 66, as illustrated in FIG. 10. Since the alignment device 66 is positioned vertically below the buffer device 60, the first conveyance mechanism 80 stores the third wafer 3 and the fourth wafer 4 into the buffer device 60, and then the first conveyance mechanism 80 can takes out the second wafer 2 subjected to alignment from the alignment device 66 by raising or lowering the first conveyance main body portion 81 without turning the first conveyance main body portion 81. Vacuuming is performed on the second load lock chamber 54 in which the first wafer 1 is stored.

Figure 11:
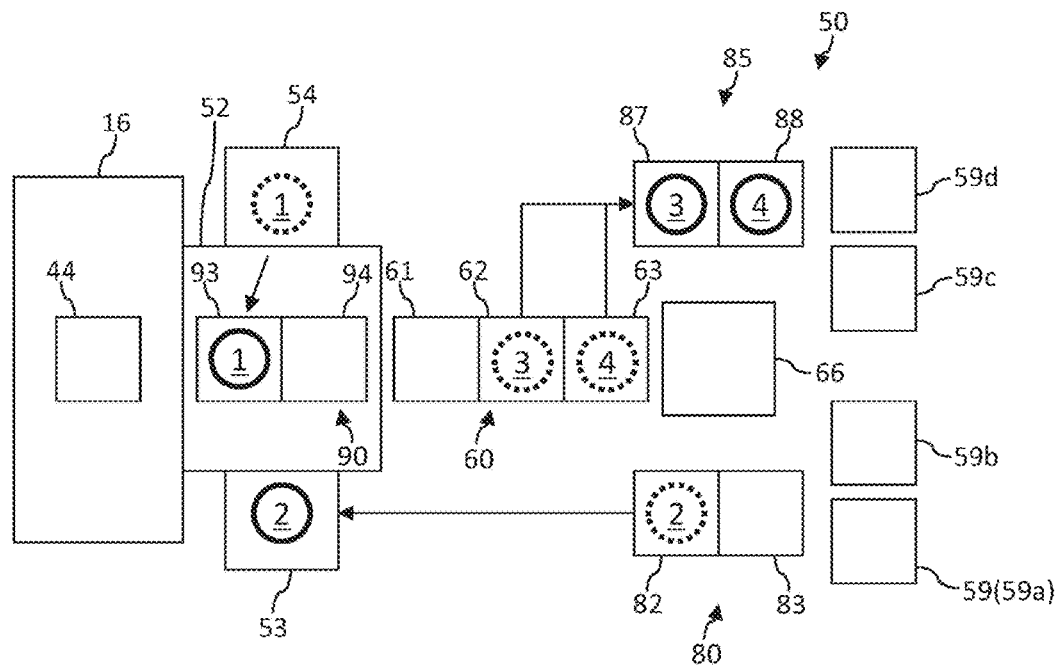
FIG. 11 is a schematic diagram that illustrates the processes for conveying wafers.

Next, the first arm 82 of the first conveyance mechanism 80 brings the second wafer 2 subjected to alignment into the first load lock chamber 53, as illustrated in FIG. 11. In addition, the second conveyance mechanism 85 simultaneously takes out the third wafer 3 and the fourth wafer 4 from the buffer device 60, similar to processes of FIG. 6. The third wafer 3 is taken out from the second buffer 62 by the third arm 87 that is the upper arm and the fourth wafer 4 is taken out from the third buffer 63 by the fourth arm 88 that is the lower arm. Furthermore, the fifth arm 92 of the intermediate conveyance mechanism 90 brings the first wafer 1 into the intermediate conveyance chamber 52 from the second load lock chamber 54.

Figure 12:
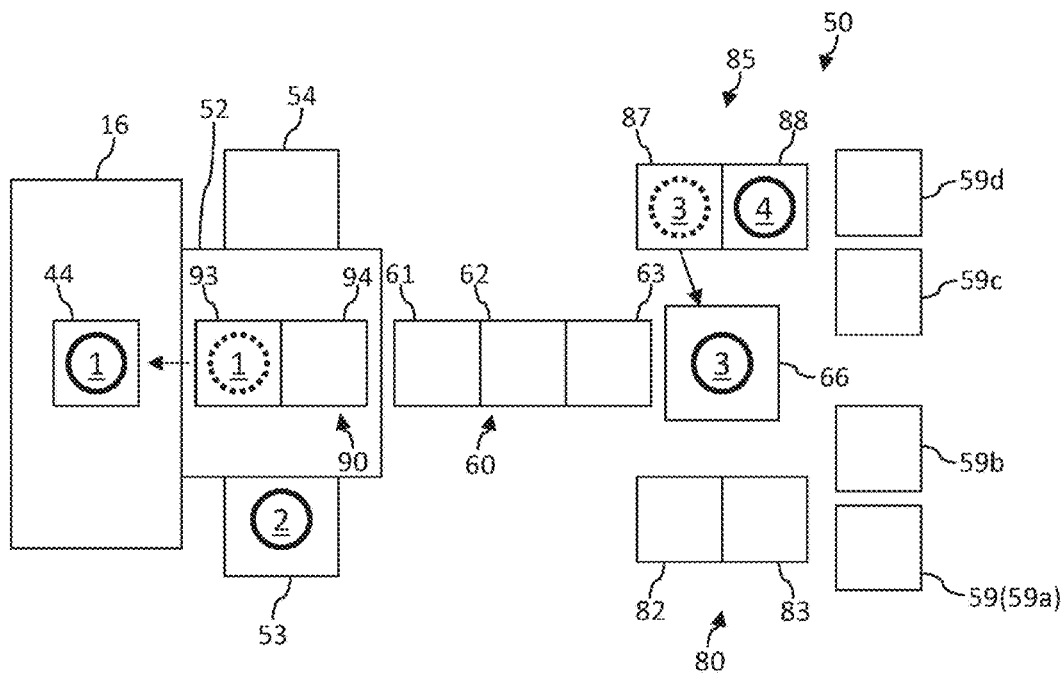
FIG. 12 is a schematic diagram that illustrates the processes for conveying wafers.

Then, the third arm 87 of the second conveyance mechanism 85 brings the third wafer 3 into the alignment device 66, as illustrated in FIG. 12. The adjustment of the center position or the rotation position is performed on the third wafer 3 that is brought into the alignment device 66 by the alignment device 66. In addition, the fourth arm 88 still holds the fourth wafer 4 temporarily. The operation of the second conveyance mechanism 85 in this case is similar to processes of FIG. 7. In this case, vacuuming is performed on the first load lock chamber 53 in which the second wafer 2 is stored. The first wafer 1 is brought into the wafer holder 44 of the vacuum processing chamber 16 from the intermediate conveyance chamber 52 by the fifth arm 92 of the intermediate conveyance mechanism 90.

Figure 13:
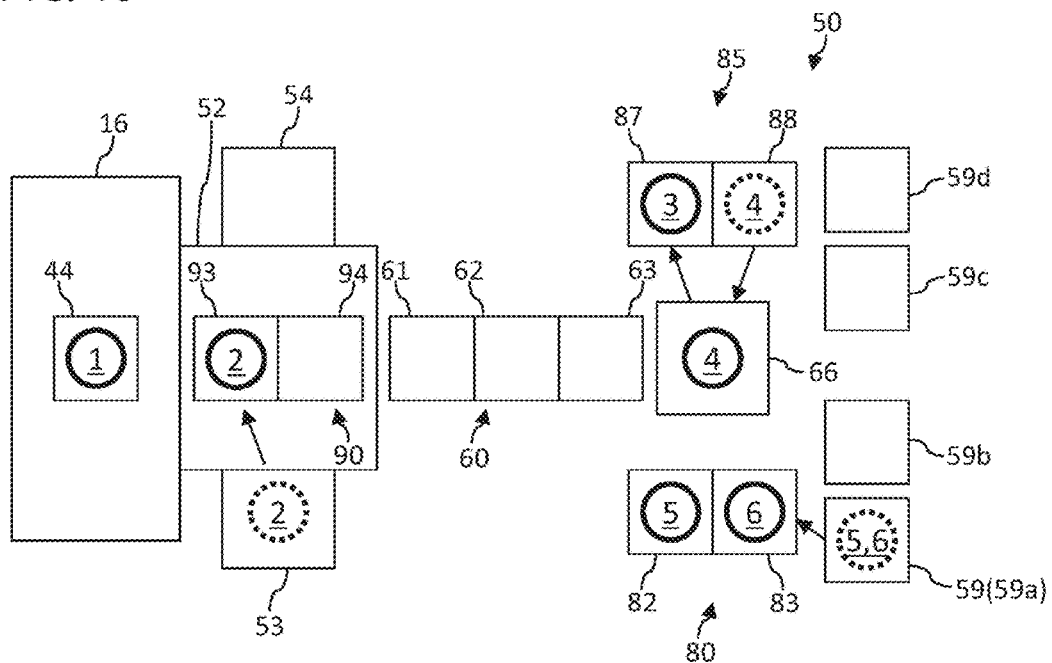
FIG. 13 is a schematic diagram that illustrates the processes for conveying wafers.

Subsequently, the third arm 87 of the second conveyance mechanism 85 takes out the third wafer 3 from the alignment device 66 and the fourth arm 88 brings the fourth wafer 4 into the alignment device 66, as illustrated in FIG. 13. In addition, the first conveyance mechanism 80 simultaneously takes out a fifth wafer 5 and a sixth wafer 6 from the wafer container 59. The fifth wafer 5 is taken out by the first arm 82 and the sixth wafer 6 is taken out by the second arm 83, similar to processes of FIG. 8. Furthermore, the fifth arm 92 of the intermediate conveyance mechanism 90 brings the second wafer 2 into the intermediate conveyance chamber 52 from the first load lock chamber 53. The ion implantation is performed on the first wafer 1 in the vacuum processing chamber 16.

Figure 14:
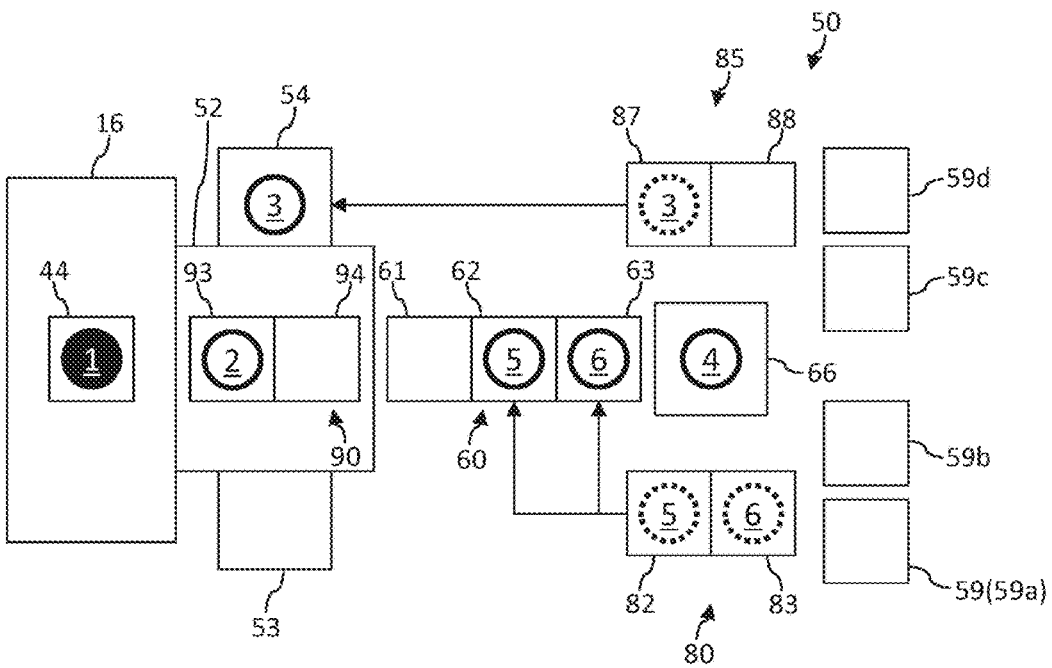
FIG. 14 is a schematic diagram that illustrates the processes for conveying wafers.

Next, the first conveyance mechanism 80 simultaneously brings the fifth wafer 5 and the sixth wafer 6 into the buffer device 60 and the third arm 87 of the second conveyance mechanism 85 brings the third wafer 3 subjected to alignment into the second load lock chamber 54, as illustrated in FIG. 14. The center position or the rotation position of the fourth wafer 4 is adjusted in the alignment device 66. Those operations described above are similar to processes of FIG. 9. In addition, the ion implantation process on the first wafer 1 in the vacuum processing chamber 16 is completed. For the clarity of explanation, the wafer subjected to the implantation process is indicated by a black circle in which a white reference numeral is applied. Those are also applied to the subsequent drawings following FIG. 15.

Figure 15:
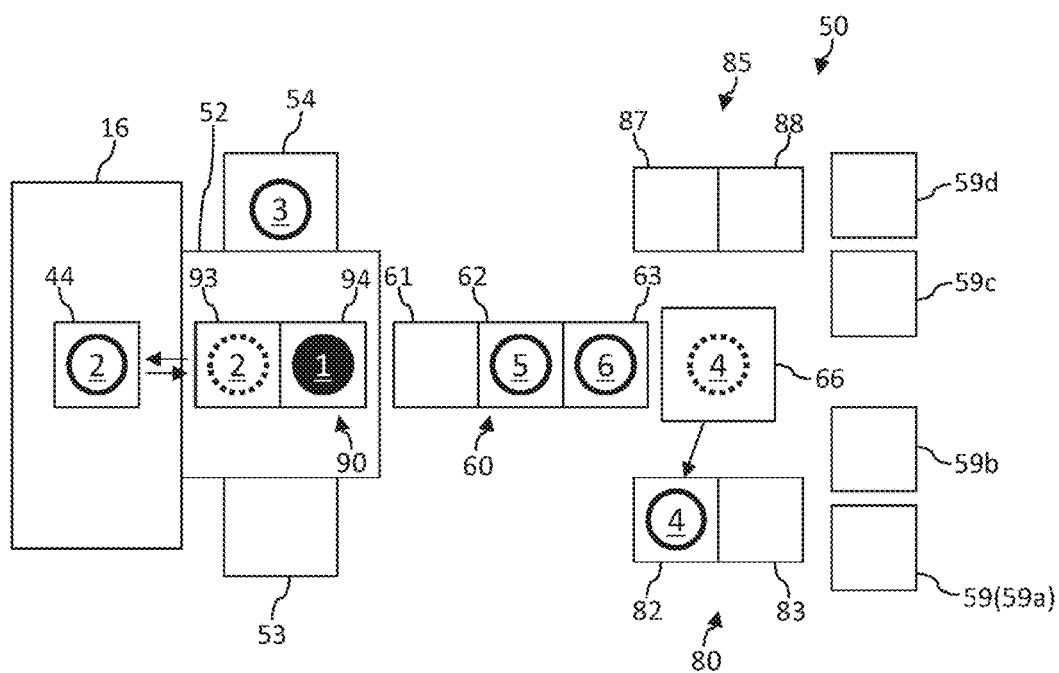
FIG. 15 is a schematic diagram that illustrates the processes for conveying wafers.

Then, the first arm 82 of the first conveyance mechanism 80 takes out the fourth wafer 4 subjected to alignment from the alignment device 66, as illustrated in FIG. 15. Those operations are similar to processes of FIG. 10. In addition, the intermediate conveyance mechanism 90 switches the first wafer 1 subjected to the implantation process and the second wafer 2 not subjected to the implantation process between the vacuum processing chamber 16 and the intermediate conveyance chamber 52. In the intermediate conveyance mechanism 90, the first wafer 1 is taken out from the vacuum processing chamber 16 by the sixth arm 93 that is a lower arm and the second wafer 2 is brought into the vacuum processing chamber 16 by the fifth arm 92 that is an upper arm. Therefore, the "swapping operation" in which the first wafer 1 and the second wafer 2 pass by each other at positions at which the first wafer 1 and the second wafer 2 deviate each other in the vertical direction is realized, in such a manner that exchange of the wafers can be performed in a reduced period.

Figure 16:
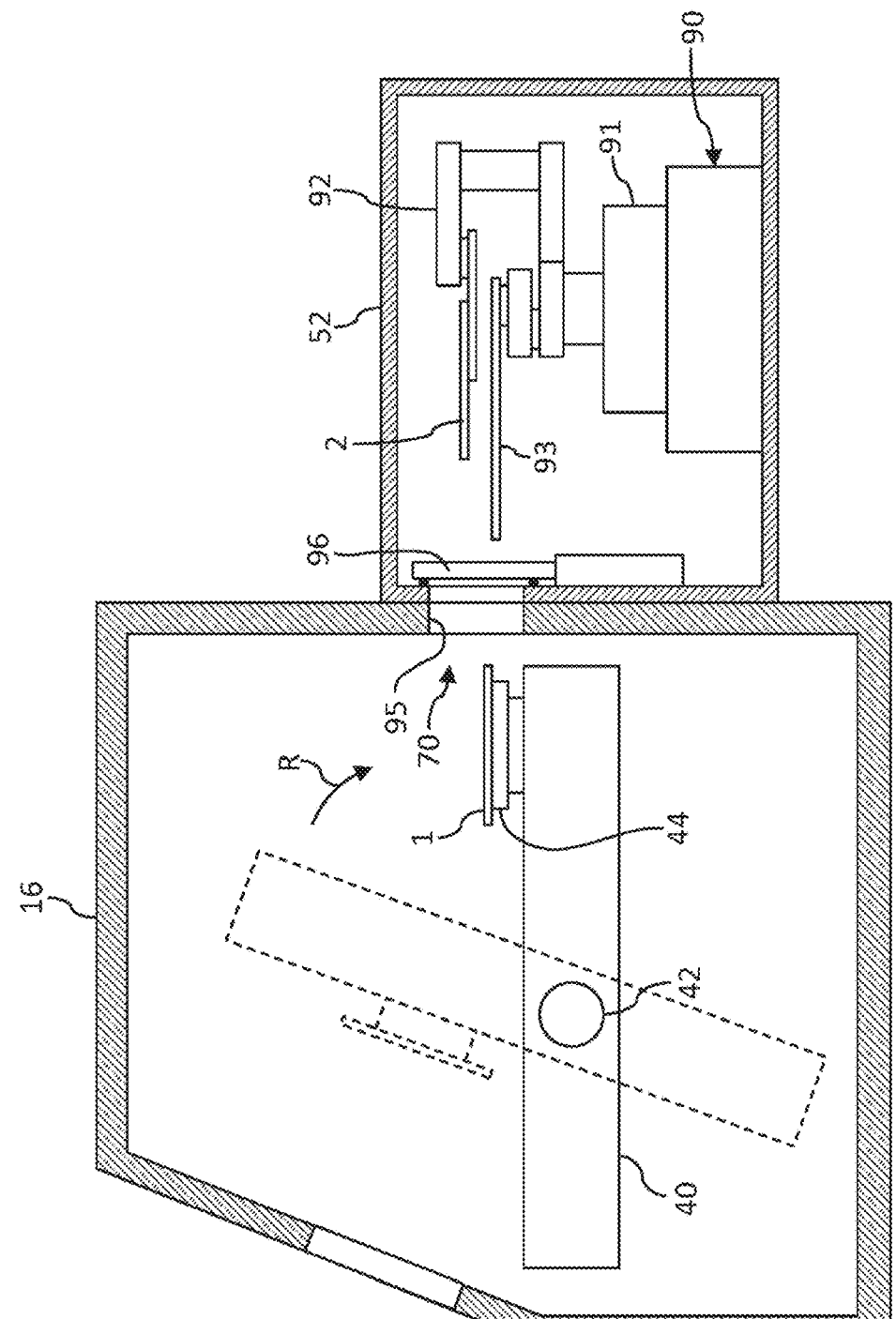
FIG. 16 is a schematic diagram that illustrates a swapping operation by an intermediate conveyance mechanism.

FIGS. 16 to 19 are schematic diagrams that illustrate a swapping operation by the intermediate conveyance mechanism 90. FIG. 16 illustrates a state before exchange of the wafer by intermediate conveyance mechanism 90 is performed. A moving mechanism 40 rotates in a direction of an arrow R from an implantation position to a conveyance position, in such a manner that the first wafer 1 subjected to the implantation process in the vacuum processing chamber 16 is in a state in which the first wafer 1 can be taken out. A communication port 95 that connects the vacuum processing chamber 16 and the intermediate conveyance chamber 52 and a gate valve 96 that closes the communication port 95 are provided in the intermediate conveyance chamber-vacuum processing chamber communicate mechanism 70 between the vacuum processing chamber 16 and the intermediate conveyance chamber 52. In the intermediate conveyance chamber 52, the second wafer 2 not subjected to the implantation process is held by the fifth arm 92 that is the upper arm of the intermediate conveyance mechanism 90.

Figure 17:
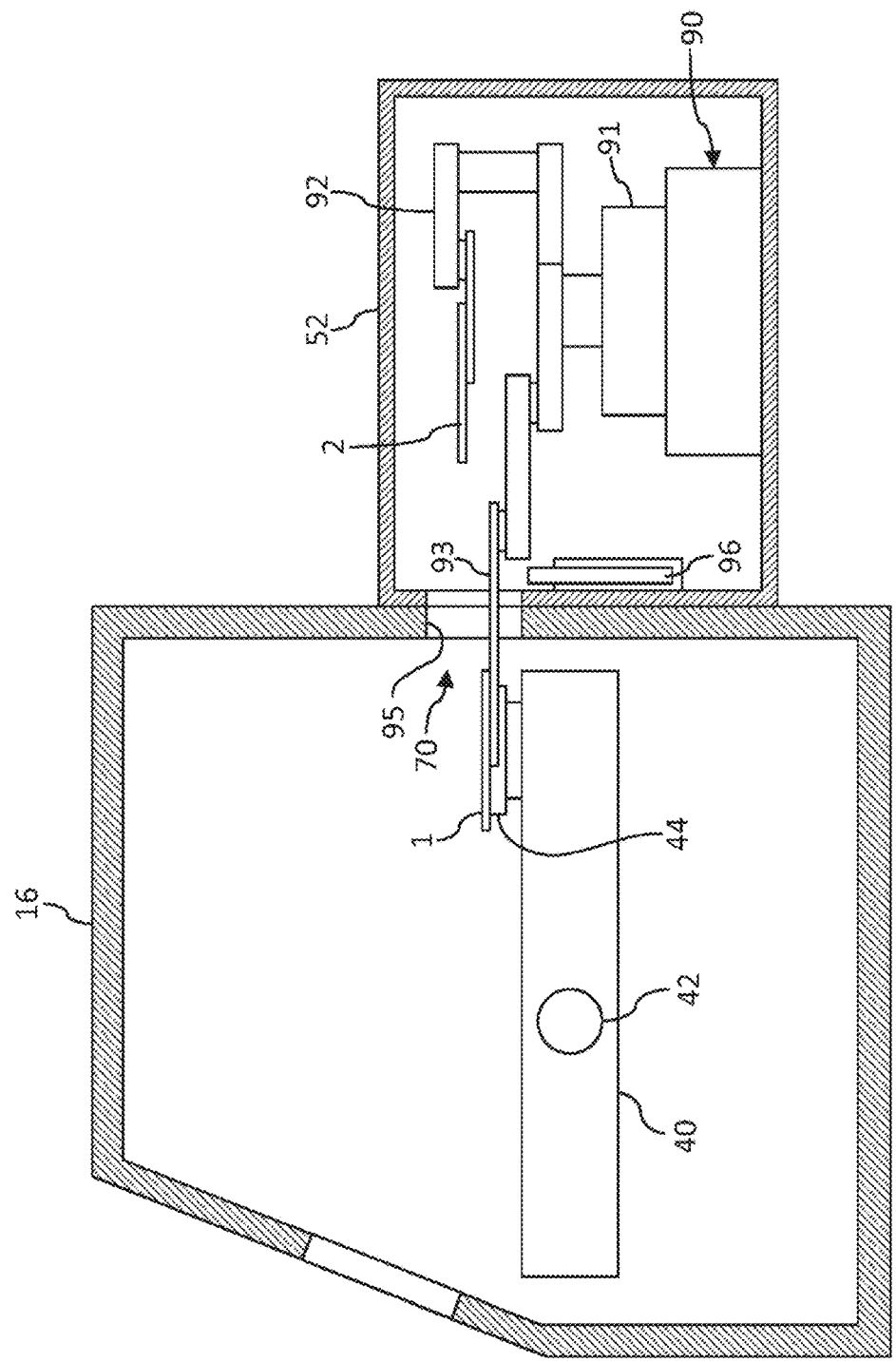
FIG. 17 is a schematic diagram that illustrates the swapping operation by the intermediate conveyance mechanism.

FIG. 17 illustrates a state where the first wafer 1 is held by the intermediate conveyance mechanism 90. When the gate valve 96 is open and the vacuum processing chamber 16 and the intermediate conveyance chamber 52 are communicated, the sixth arm 93 that is the lower arm of the intermediate conveyance mechanism 90 extends toward the vacuum processing chamber 16 and the first wafer 1 is held by a holder in a tip end of the sixth arm 93.

Figure 18:
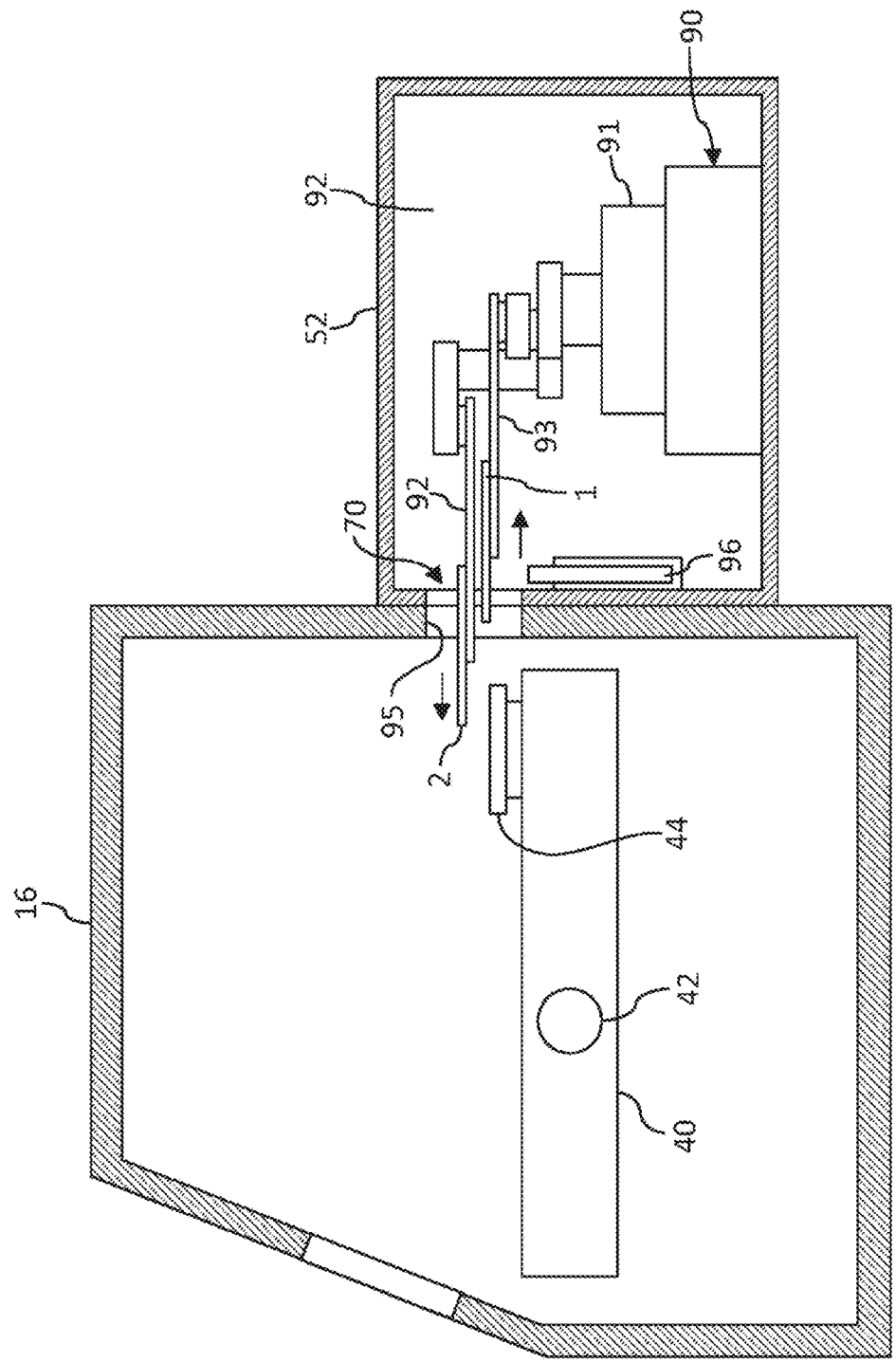
FIG. 18 is a schematic diagram that illustrates the swapping operation by the intermediate conveyance mechanism.

FIG. 18 illustrates a state where the first wafer 1 and the second wafer 2 are swapped by the intermediate conveyance mechanism 90. In the intermediate conveyance mechanism 90, the first wafer 1 is brought into the intermediate conveyance chamber 52 from the vacuum processing chamber 16 by retracting the sixth arm 93 in a direction A1 and the second wafer 2 is taken out to the vacuum processing chamber 16 from the intermediate conveyance chamber 52 by extending the fifth arm 92 in a direction A2. In this case, a swapping operation in which the first wafer 1 and the second wafer 2 pass by each other is realized in a positional relationship in which the second wafer 2 is located on an upper side and the first wafer 1 is located on a lower side. When a vertical relationship between the first wafer 1 and the second wafer 2 is reversed, the second wafer 2 collides with the moving mechanism 40 during a period for bringing the second wafer 2 into the chamber, it is not possible to perform the wafer exchange by the swapping operation.

Figure 19:
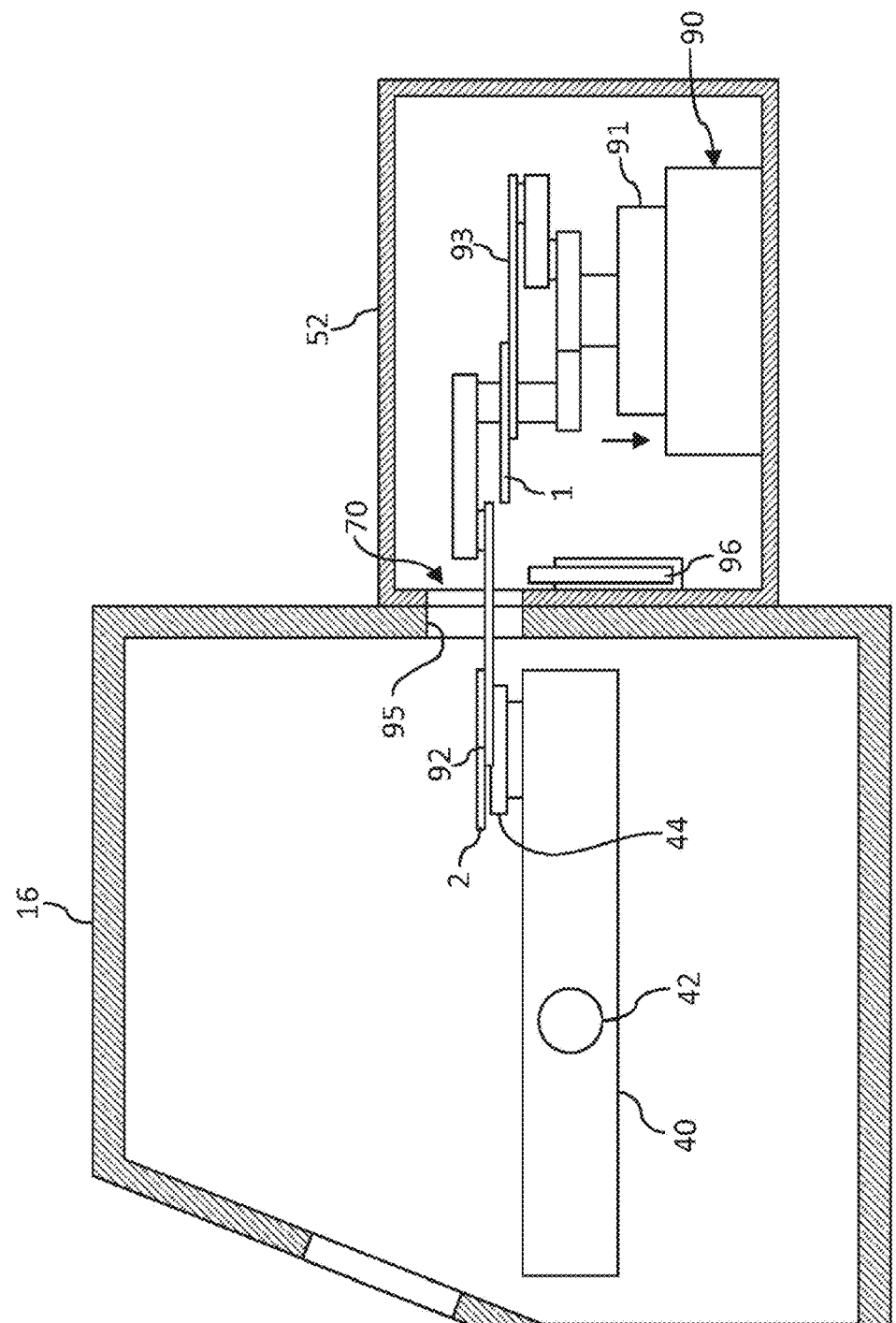
FIG. 19 is a schematic diagram that illustrates the swapping operation by the intermediate conveyance mechanism.

FIG. 19 illustrates a state where the second wafer 2 is mounted on the wafer holder 44 of the moving mechanism 40 by the intermediate conveyance mechanism 90. In the intermediate conveyance mechanism 90, the first wafer 1 is accommodated in the intermediate conveyance chamber 52 by retracting the sixth arm 93 and the fifth arm 92 is extended to a placing position of the second wafer 2, and then positions of the fifth arm 92 and the sixth arm 93 are lowered by lowering the intermediate conveyance main body portion 91. The second wafer 2 is mounted on the wafer holder 44, and then the fifth arm 92 is retracted and the gate valve 96 is closed, in such a manner that exchanging of the first wafer 1 and the second wafer 2 is completed. Then, the moving mechanism 40 rotates from the conveyance position to the implantation position and ion implantation is started to the second wafer 2.

Figure 20:
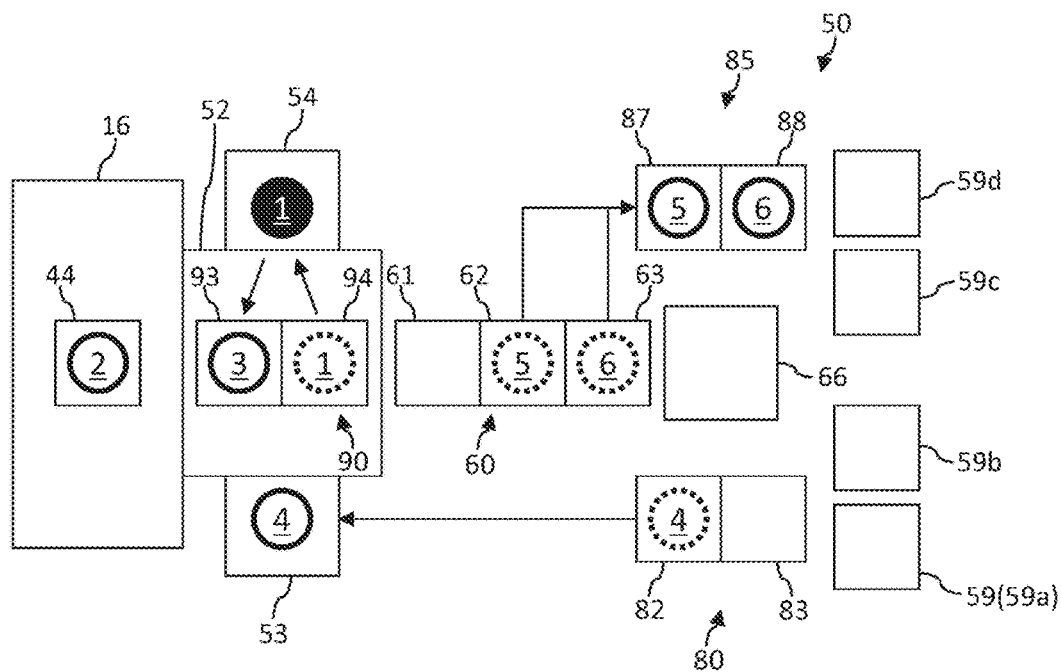
FIG. 20 is a schematic diagram that illustrates the processes for conveying wafers.

Next, the first arm 82 of the first conveyance mechanism 80 brings the fourth wafer 4 subjected to alignment into the intermediate conveyance chamber 52 and the second conveyance mechanism 85 simultaneously takes out the fifth wafer 5 and the sixth wafer 6 from the buffer device 60, as illustrated in FIG. 20. Those operations are similar to processes of FIG. 11. The intermediate conveyance mechanism 90 exchanges the first wafer 1 subjected to the implantation process and the third wafer 3 not subjected to the implantation process between the intermediate conveyance chamber 52 and the second load lock chamber 54. The intermediate conveyance mechanism 90 brings the third wafer 3 into the intermediate conveyance chamber 52 from the second load lock chamber 54 using the fifth arm 92 that does not hold the wafer. Subsequently, the intermediate conveyance mechanism 90 brings the first wafer 1 into the second load lock chamber 54 from the intermediate conveyance chamber 52 using the sixth arm 93 that holds the first wafer 1. In the vacuum processing chamber 16, the ion implantation process is performed on the second wafer 2.

Figure 21:
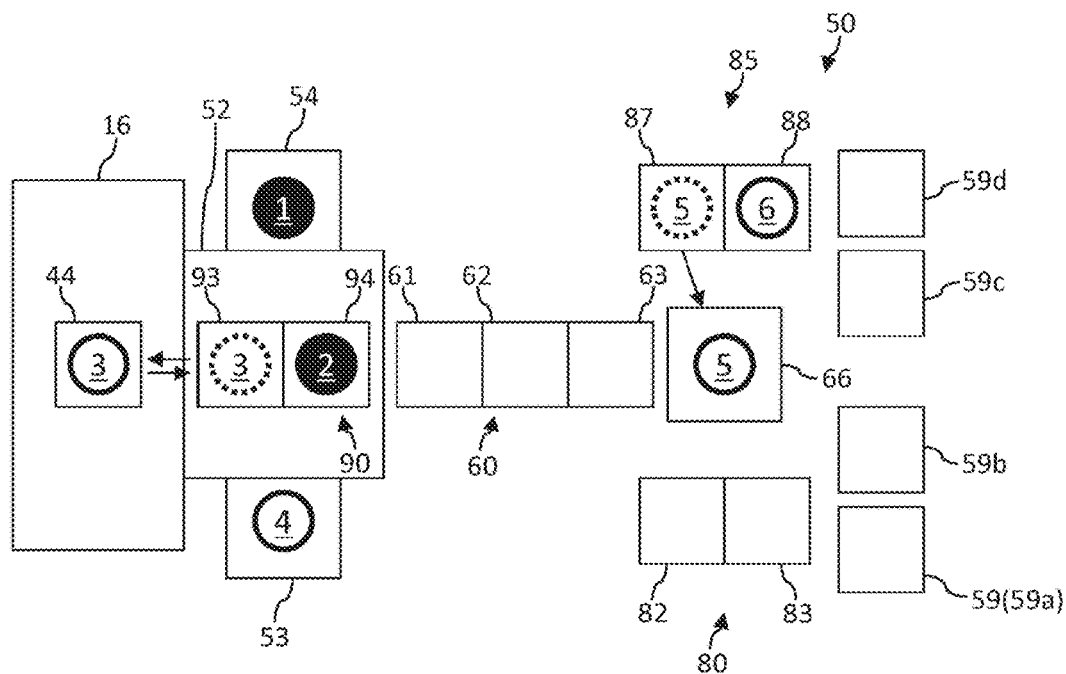
FIG. 21 is a schematic diagram that illustrates the processes for conveying wafers.

Next, the third arm 87 of the second conveyance mechanism 85 brings the fifth wafer 5 into the alignment device 66, as illustrated in FIG. 21. Adjustment of the center position or the rotation position is performed on the fifth wafer 5 that is brought into the alignment device 66 by the alignment device 66. In addition, the fourth arm 88 still holds the sixth wafer 6 temporarily. Those operations are similar to processes of FIG. 12. Additionally, the intermediate conveyance mechanism 90 switches the second wafer 2 subjected to the implantation process and the third wafer 3 not subjected to the implantation process between the vacuum processing chamber 16 and the intermediate conveyance chamber 52. This operation is similar to a "swapping operation" in processes of FIG. 15. That is, in the intermediate conveyance mechanism 90, the second wafer 2 is taken out from the vacuum processing chamber 16 by the sixth arm 93 that is the lower arm and the third wafer 3 is brought into the vacuum processing chamber 16 by the fifth arm 92 that is the upper arm. In this case, vacuuming is performed on the first load lock chamber 53 in which the fourth wafer 4 is stored. Releasing (ventilation) to the atmosphere is performed on the second load lock chamber 54 in which the first wafer 1 subjected to the implantation process is stored.

Figure 22:
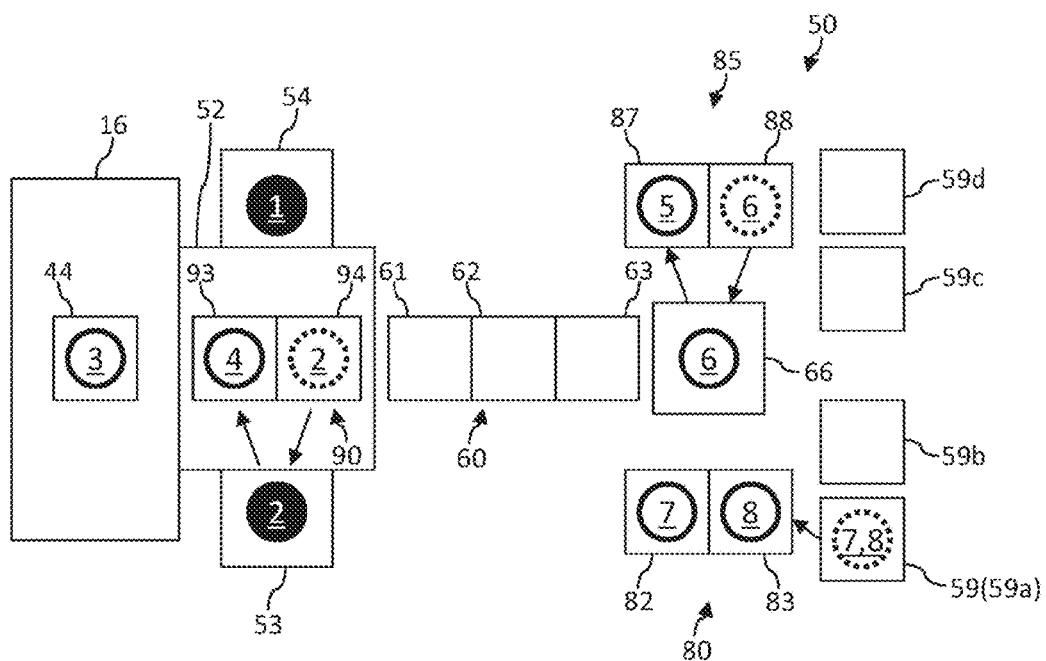
FIG. 22 is a schematic diagram that illustrates the processes for conveying wafers.

The third arm 87 of the second conveyance mechanism 85 takes out the fifth wafer 5 from the alignment device 66 and the fourth arm 88 brings the sixth wafer 6 into the alignment device 66, as illustrated in FIG. 22. In addition, the first conveyance mechanism 80 simultaneously takes out a seventh wafer 7 and an eighth wafer 8 from the wafer container 59. Those operations are similar to processes of FIG. 13. The intermediate conveyance mechanism 90 exchanges the second wafer 2 subjected to the implantation process and the fourth wafer 4 not subjected to implantation process between the intermediate conveyance chamber 52 and the first load lock chamber 53. The intermediate conveyance mechanism 90 brings the fourth wafer 4 into the intermediate conveyance chamber 52 from the first load lock chamber 53 using the fifth arm 92 that does not hold the wafer. Subsequently, the intermediate conveyance mechanism 90 brings the second wafer 2 into the first load lock chamber 53 from the intermediate conveyance chamber 52 using the sixth arm 93 that holds the second wafer 2. In the vacuum processing chamber 16, the ion implantation is performed on the third wafer 3. Ventilation is performed in the second load lock chamber 54.

Figure 23:
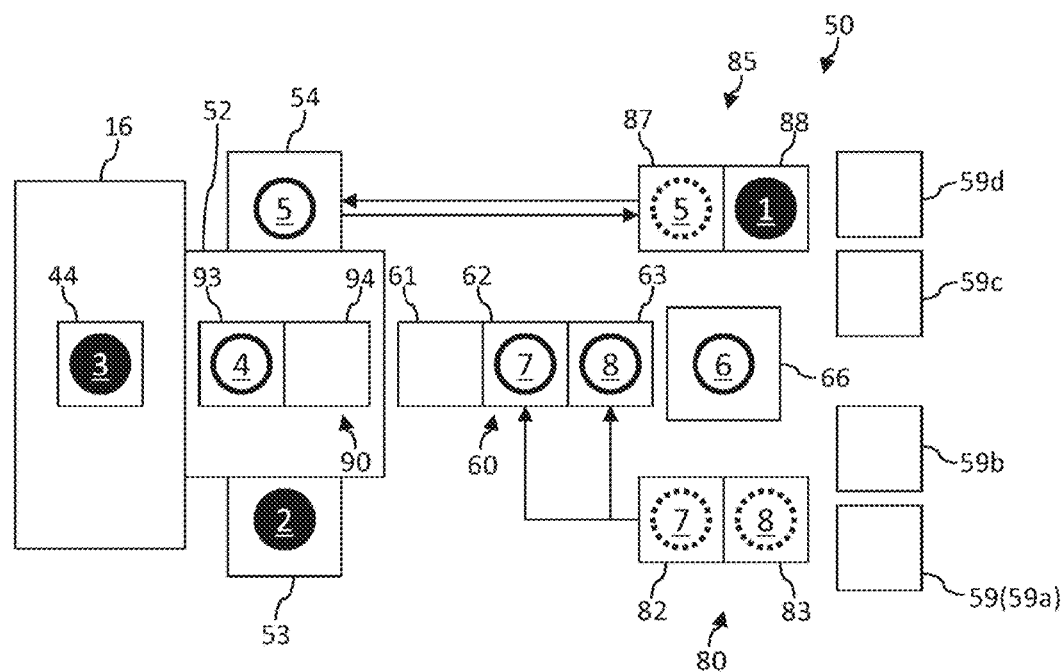
FIG. 23 is a schematic diagram that illustrates the processes for conveying wafers.

Next, the first conveyance mechanism 80 simultaneously brings the seventh wafer 7 and the eighth wafer 8 into the buffer device 60, as illustrated in FIG. 23. In addition, the second conveyance mechanism 85 takes out the first wafer 1 subjected to the implantation process from the second load lock chamber 54 and brings the fifth wafer 5 subjected to alignment into the second load lock chamber 54. The second conveyance mechanism 85 takes out the first wafer 1 using the fourth arm 88 that is the lower arm and brings the fifth wafer 5 into the second load lock chamber 54 using the third arm 87 that is the upper arm. Therefore, a "swapping operation" in which the first wafer 1 and the fifth wafer 5 pass by each other at positions at which the first wafer 1 and the fifth wafer 5 deviate from each other in the vertical direction is realized, in such a manner that exchange of the wafers can be performed in a reduced period. In the vacuum processing chamber 16, the ion implantation is performed on the third wafer 3. Furthermore, ventilation is performed in the second load lock chamber 54.

Figure 24:
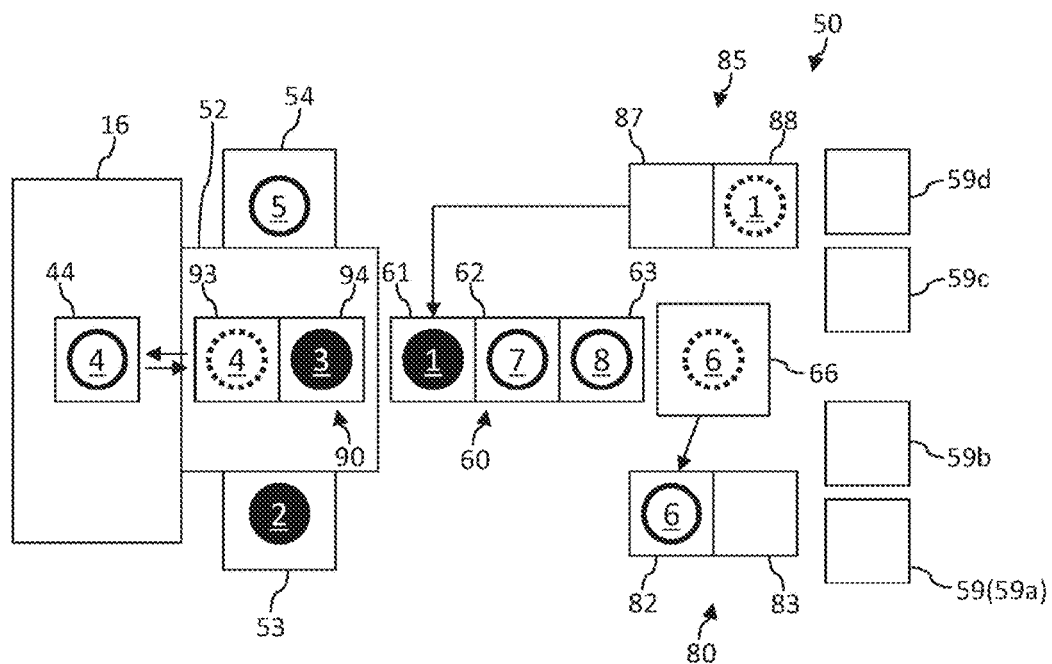
FIG. 24 is a schematic diagram that illustrates the processes for conveying wafers.

Next, the first arm 82 of the first conveyance mechanism 80 takes out the sixth wafer 6 subjected to alignment from the alignment device 66, as illustrated in FIG. 24. The intermediate conveyance mechanism 90 switches the third wafer 3 subjected to the implantation process and the fourth wafer 4 not subjected to the implantation process between the vacuum processing chamber 16 and the intermediate conveyance chamber 52 by the "swapping operation" described above. Those operations are similar to processes of FIG. 15. The second conveyance mechanism 85 stores the first wafer 1 subjected to the implantation process which is held by the fourth arm 88 into the buffer device 60. Since the seventh wafer 7 and the eighth wafer 8 are stored in the second buffer 62 and the third buffer 63 of the buffer device 60, the first wafer 1 is stored into the first buffer 61 that is in a vacant state. Furthermore, ventilation is performed in the first load lock chamber 53 and vacuuming is performed in the second load lock chamber 54.

Figure 25:
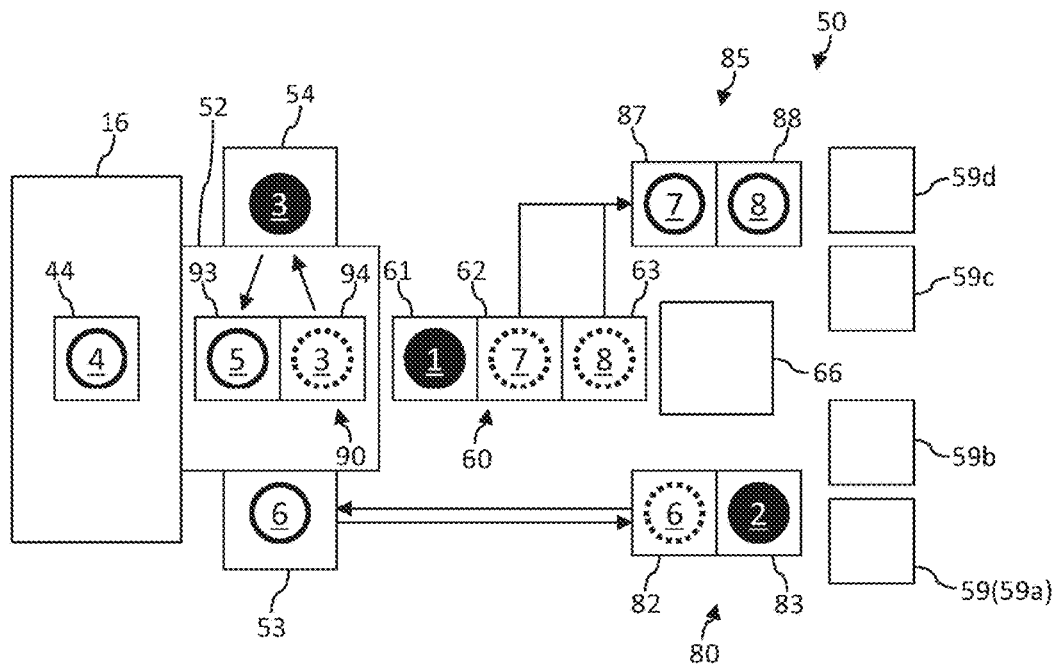
FIG. 25 is a schematic diagram that illustrates the processes for conveying wafers.

Then, the second conveyance mechanism 85 simultaneously takes out the seventh wafer 7 and the eighth wafer 8 from the buffer device 60, as illustrated in FIG. 25. The intermediate conveyance mechanism 90 exchanges the third wafer 3 subjected to the implantation process and the fifth wafer 5 not subjected to the implantation process between the intermediate conveyance chamber 52 and the second load lock chamber 54. Those operations are similar to processes of FIG. 20. The first conveyance mechanism 80 takes out the second wafer 2 subjected to the implantation process from the first load lock chamber 53 and brings the sixth wafer 6 subjected to alignment into the first load lock chamber 53. The first conveyance mechanism 80 takes out the second wafer 2 using the second arm 83 that is the lower arm and brings the sixth wafer 6 into the first load lock chamber 53 using the first arm 82 that is the upper arm. Therefore, a "swapping operation" in which the second wafer 2 and the sixth wafer 6 pass by each other at positions at which the second wafer 2 and the sixth wafer 6 deviate from each other in the vertical direction is realized, in such a manner that exchange of the wafers can be performed in a reduced period. In the vacuum processing chamber 16, the ion implantation is performed on the fourth wafer 4.

Figure 26:
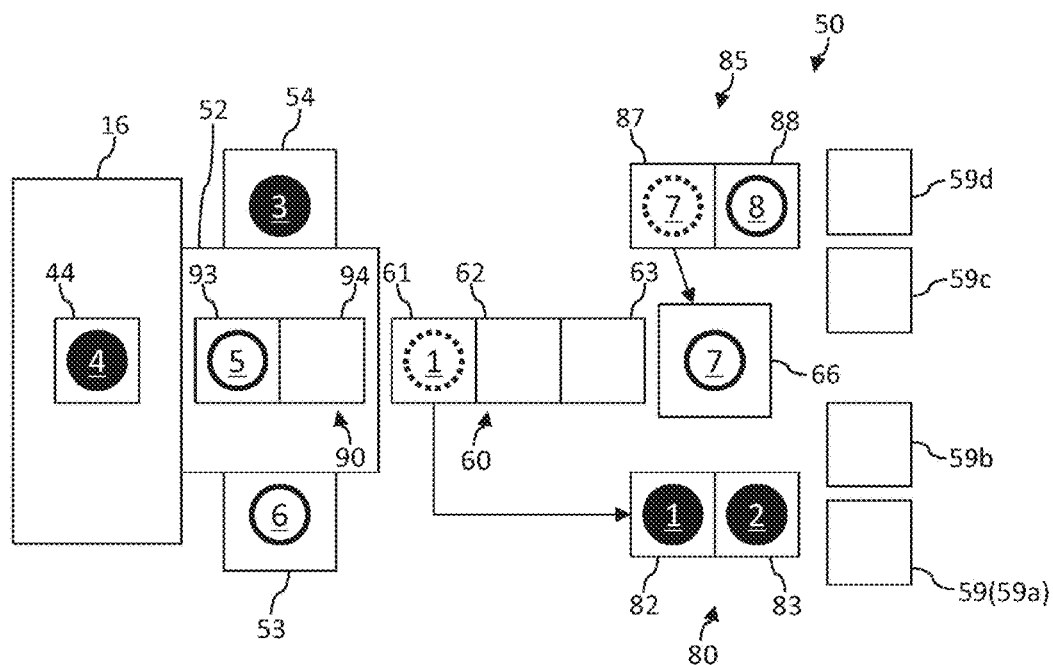
FIG. 26 is a schematic diagram that illustrates the processes for conveying wafers.

Then, the third arm 87 of the second conveyance mechanism 85 brings the seventh wafer 7 into the alignment device 66 and the fourth arm 88 is on standby in a state where the fourth arm 88 temporarily holds the eighth wafer 8, as illustrated in FIG. 26. Those operations are similar to processes of FIG. 21. The first conveyance mechanism 80 takes out the first wafer 1 from the first buffer 61 of the buffer device 60 using the first arm 82 that does not hold the wafer. Therefore, the first conveyance mechanism 80 is in a state where the first conveyance mechanism 80 holds the first wafer 1 and the second wafer 2. In the vacuum processing chamber 16, the implantation process is performed on the fourth wafer 4. Vacuuming is performed in the first load lock chamber 53 and ventilation is performed in the second load lock chamber 54.

Figure 27:
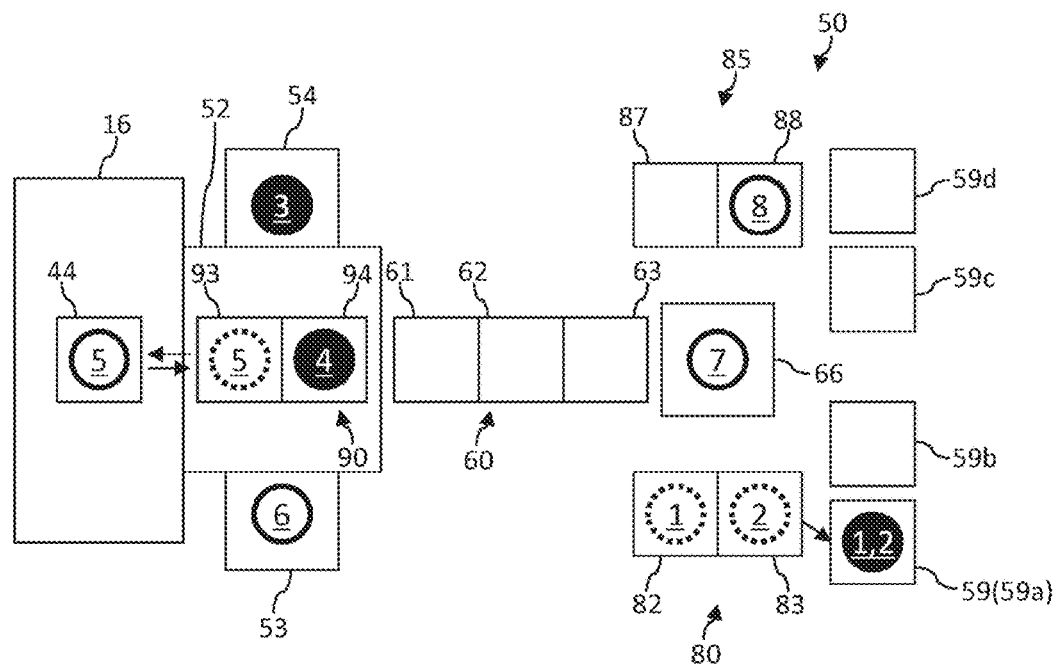
FIG. 27 is a schematic diagram that illustrates the processes for conveying wafers.

Subsequently, the first conveyance mechanism 80 simultaneously stores the first wafer 1 and the second wafer 2 into the wafer container 59, as illustrated in FIG. 27. The first wafer 1 is stored by the first arm 82 that is the upper arm and the second wafer 2 is stored by the second arm 83 that is the lower arm, similar to the process for taking out the wafer of FIG. 4. The intermediate conveyance mechanism 90 switches the fourth wafer 4 subjected to the implantation process and the fifth wafer 5 not subjected to the implantation process between the vacuum processing chamber 16 and the intermediate conveyance chamber 52. This operation is similar to the "swapping operation" in the processes of FIG. 24. Vacuuming is performed in the first load lock chamber 53 and ventilation is performed in the second load lock chamber 54.

Through the processes described above, the first wafer 1 and the second wafer 2 that are taken out from the wafer container 59 are brought into the vacuum processing chamber 16 and subjected to the implantation process, and then the first wafer 1 and the second wafer 2 subjected to implantation process are stored into the wafer container 59. Processes similar to those of FIGS. 22 to 27 repeat following the processes of FIG. 27, in such a manner that subsequent wafers are brought into the vacuum processing chamber 16 from the wafer container 59 in order and subjected to the ion implantation process, and then the wafers are stored into the wafer container 59. In a pair of two wafers that are simultaneously taken out from the wafer container 59, one wafer to which an odd number is applied is brought into the vacuum processing chamber 16 via the second load lock chamber 54 and taken out from the vacuum processing chamber 16 via the second load lock chamber 54. Furthermore, in the pair of two wafers that are simultaneously taken out from the wafer container 59, the other to which an even number is applied is brought into the vacuum processing chamber 16 via the first load lock chamber 53 and taken out from the vacuum processing chamber 16 via the first load lock chamber 53.

The operations of the first conveyance mechanism 80, the second conveyance mechanism 85, and the intermediate conveyance mechanism 90 that are illustrated in FIGS. 4 to 15 and FIGS. 20 to 27 may be simultaneously performed, be performed in a state where respective operation periods partially overlap each other, or be performed in a state where the respective operation periods do not overlap each other.

Next, a flow of respective operations of the first conveyance mechanism 80, the second conveyance mechanism 85, and the intermediate conveyance mechanism 90 will be described using a flow chart. Additionally, it is understood that each processing step in the flow chart may be appropriately skipped in accordance with, for example, the arrangement of wafers at the time. In terms of skipping each process step, when, for example, a wafer that is to be subjected to carrying-in or carrying-out is not prepared, the process of carrying-in or carrying-out is skipped.

Figure 28:
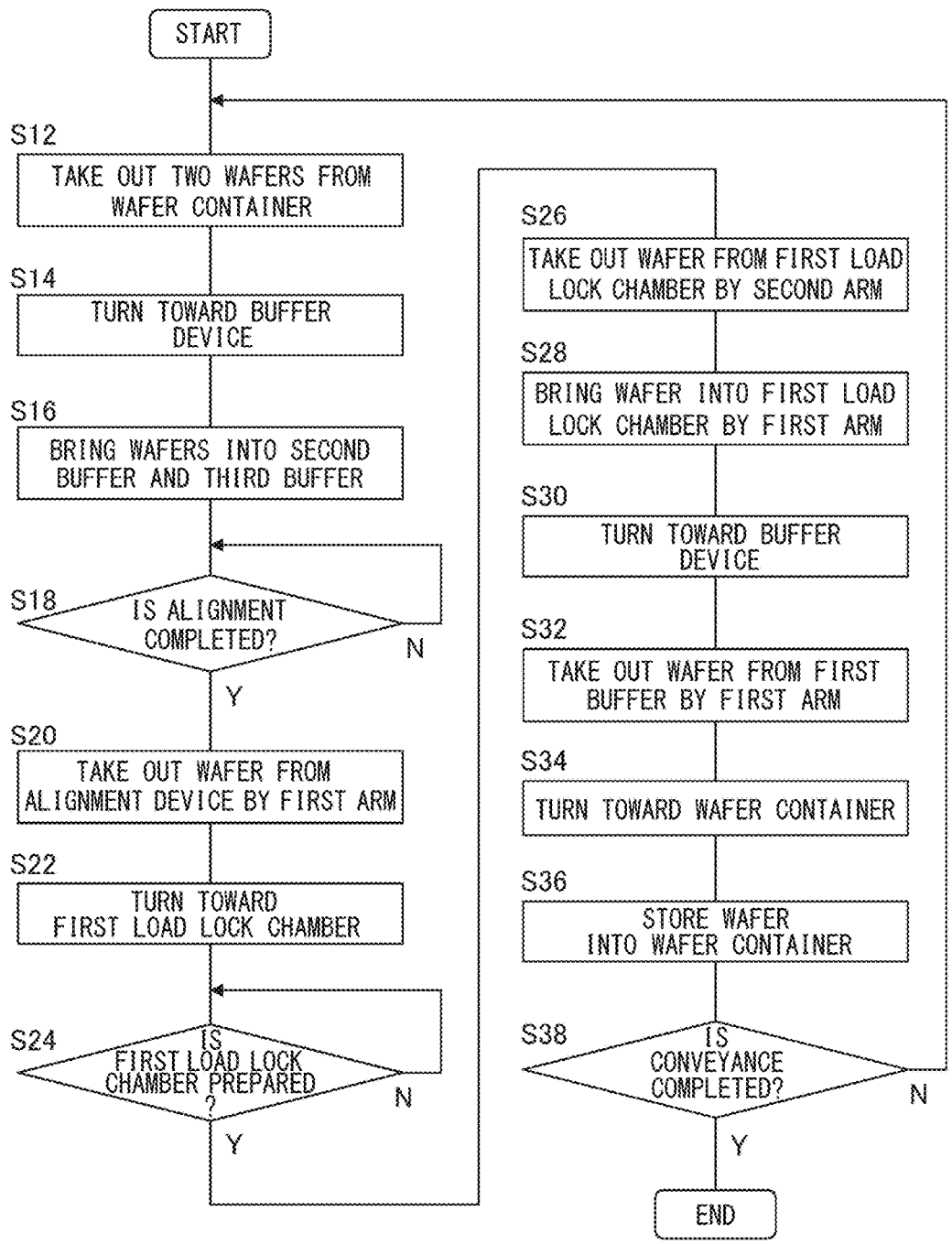
FIG. 28 is a flow chart that illustrates a flow of the operation of the first conveyance mechanism.

FIG. 28 is a flow chart that illustrates a flow of the operation of the first conveyance mechanism 80. The first conveyance mechanism 80 takes out two wafers from the wafer container 59 using the first arm 82 and the second arm 83 (S12) and turns the first conveyance main body portion 81 toward the buffer device 60 (S14). Then, the first conveyance mechanism 80 brings the wafer into the second buffer 62 using the first arm 82 and brings the wafer into the third buffer 63 using the second arm 83 (S16). Next, the first conveyance mechanism 80 waits completion of position adjustment by the alignment device 66 (N in S18) and, when the alignment is completed (Y in S18), the first conveyance mechanism 80 takes out the wafer from the alignment device 66 using the first arm 82 (S20).

Subsequently, the first conveyance mechanism 80 turns the first conveyance main body portion 81 toward the first load lock chamber 53 (S22) and waits completion of ventilation of the first load lock chamber 53 (N in S24). When preparation is completed (Y in S24), the first conveyance mechanism 80 takes out a processed wafer from the first load lock chamber 53 using the second arm 83 (S26) and brings an unprocessed wafer into the first load lock chamber 53 using the first arm 82 (S28). Then, the first conveyance mechanism 80 turns the first conveyance main body portion 81 toward the buffer device 60 (S30) and takes out a processed wafer from the first buffer 61 (S32). Subsequently, the first conveyance mechanism 80 turns the first conveyance main body portion 81 toward the wafer container 59 (S34) and stores the processed wafers that are respectively held by the first arm 82 and the second arm 83 into the wafer container 59 (S36). When conveyance of the wafer is not completed (N in S38), the first conveyance mechanism 80 repeats the processes of S12 to S36. When the conveyance of the wafer is completed (Y in S38), this flow is finished.

For example, in a case where carrying-out of an unprocessed wafer (wafer not subjected to the implantation process) is entirely completed and it is necessary only to return a processed wafer (wafer subjected to the implantation process) to the wafer container 59, where it is not necessary to take out an unprocessed wafer from the wafer container 59, the processes of S12 to S20 and S28 are skipped. Furthermore, for example, in a case where an unprocessed wafer is not brought into the vacuum processing chamber 16 and the ion implantation process is not started, where there is no processed wafer that is to be stored into the wafer container 59, the processes of S26, S32, and S36 are skipped.

Figure 29:
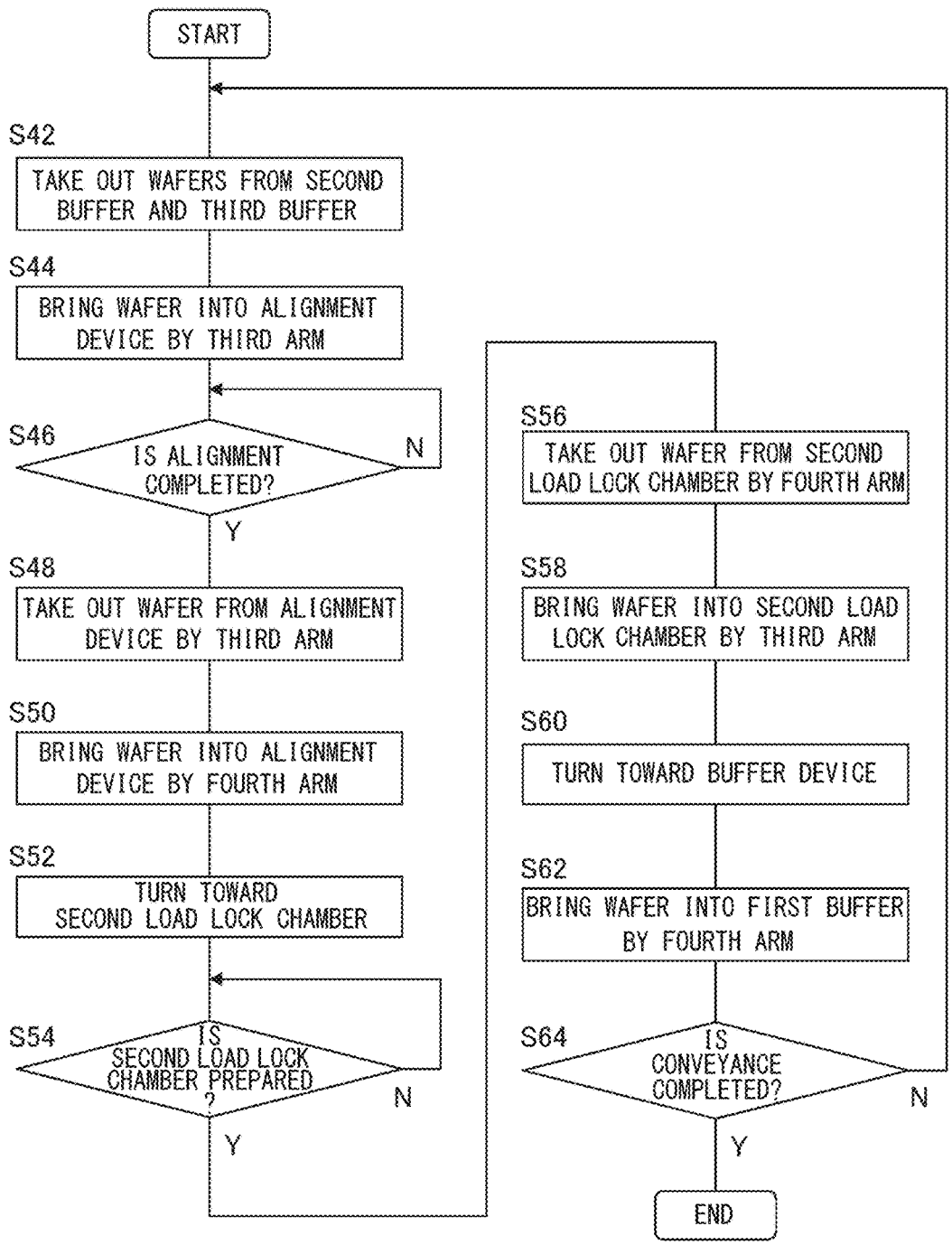
FIG. 29 is a flow chart that illustrates a flow of the operation of a second conveyance mechanism.

FIG. 29 is a flow chart that illustrates a flow of the operation of the second conveyance mechanism 85. The second conveyance mechanism 85 takes out the wafer from the second buffer 62 using the third arm 87 and takes out the wafer from the third buffer 63 using the fourth arm 88 (S42). Then, the second conveyance mechanism 85 brings the wafer that is held by the third arm 87 into the alignment device 66 (S44). Next, the second conveyance mechanism 85 waits completion of position adjustment by the alignment device 66 (N in S46) and, when the alignment is completed (Y in S46), the second conveyance mechanism 85 takes out the wafer using the third arm 87 (S48) and brings the wafer that is held by the fourth arm 88 into the alignment device 66 (S50).

Subsequently, the second conveyance mechanism 85 turns the second conveyance main body portion 86 toward the second load lock chamber 54 (S52) and waits completion of ventilation of the second load lock chamber 54 (N in S54). When preparation is completed (Y in S54), the second conveyance mechanism. 85 takes out the processed wafer from the second load lock chamber 54 using the fourth arm 88 (S56) and brings the unprocessed wafer into the second load lock chamber 54 using the third arm 87 through the swapping operation (S58). Next, the second conveyance mechanism 85 turns the second conveyance main body portion 86 toward the buffer device 60 (S60) and brings the processed wafer that is held by the fourth arm 88 into the first buffer 61 (S62). When the conveyance of the wafer is not completed (N in S64), the second conveyance mechanism 85 repeats the processes of S12 to S62. When the conveyance of the wafer is completed (Y in S64), this flow is finished.

Furthermore, when an unprocessed wafer is not stored in the buffer device 60, the processes of the S42 to S50 and the S58 are skipped. In addition, when there is no processed wafer that is to be taken out from the second load lock chamber 54, the processes of S56 and S62 are skipped.

Figure 30:
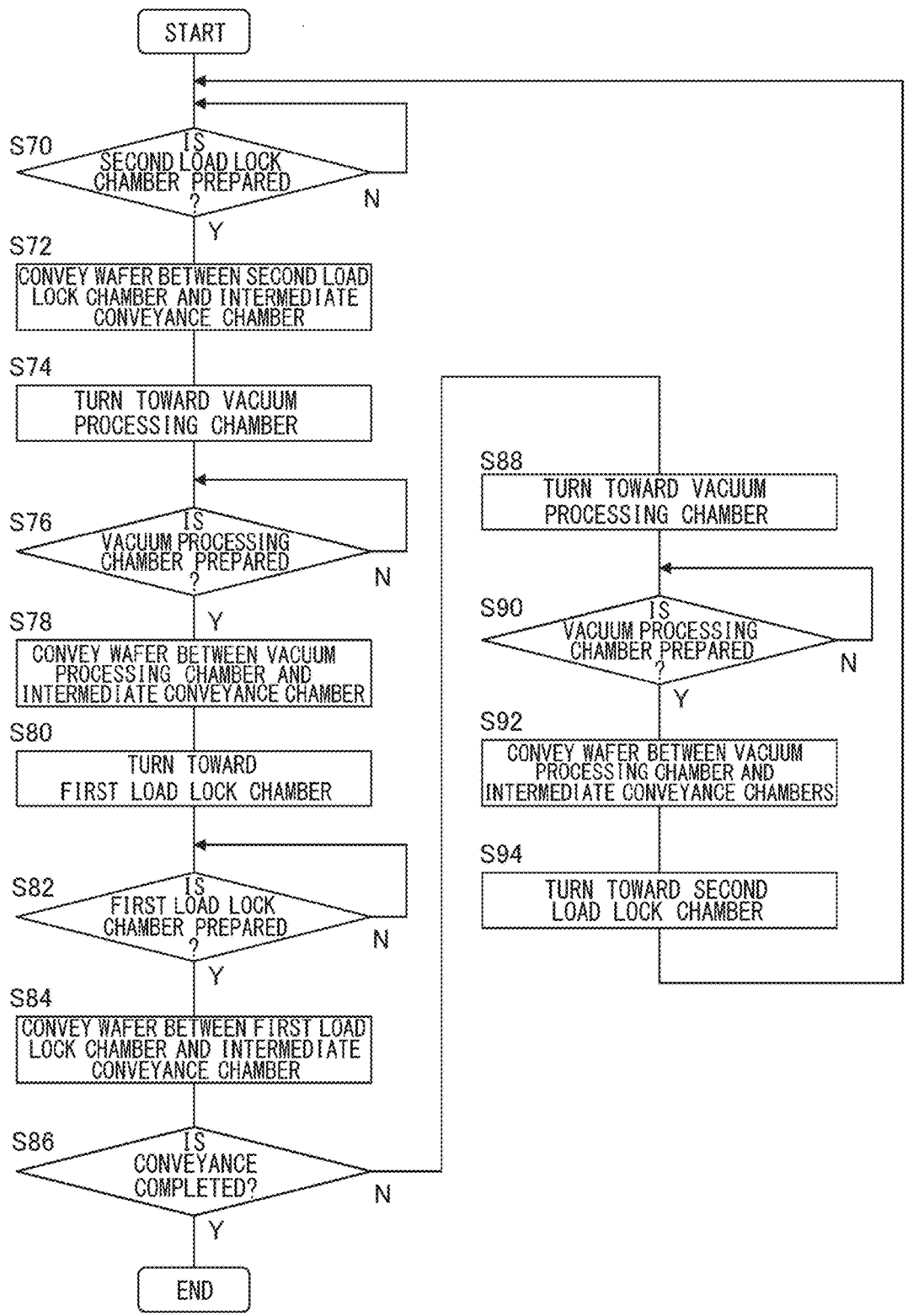
FIG. 30 is a flowchart that illustrates a flow of the operation of the intermediate conveyance mechanism.

FIG. 30 is a flowchart that illustrates a flow of the operation of the intermediate conveyance mechanism 90. The intermediate conveyance mechanism 90 waits completion of vacuuming of the second load lock chamber 54 (N in S70). When preparation is completed (Y in S70), the intermediate conveyance mechanism 90 conveys the wafer between the second load lock chamber 54 and the intermediate conveyance chamber 52 (S72). When wafers are in both the second load lock chamber 54 and the intermediate conveyance chamber 52, the intermediate conveyance mechanism 90 exchanges positions of the wafers. When wafer is in either the second load lock chamber 54 or the intermediate conveyance chamber 52, the intermediate conveyance mechanism 90 moves the wafer to the other. Furthermore, when wafer is in neither the second load lock chamber 54 nor intermediate conveyance chamber 52, the process of the S72 is skipped.

Next, the intermediate conveyance mechanism 90 turns the intermediate conveyance main body portion 91 toward the vacuum processing chamber 16 (S74) and waits completion of the implantation process in the vacuum processing chamber 16 (N in S76). When preparation is completed (Y in S76), the intermediate conveyance mechanism 90 conveys the wafer between the vacuum processing chamber 16 and the intermediate conveyance chamber 52 (S78). When wafers are in both the vacuum processing chamber 16 and the intermediate conveyance chamber 52, the intermediate conveyance mechanism 90 exchanges positions of the wafers by the swapping operation. When wafer is in either the vacuum processing chamber 16 or the intermediate conveyance chamber 52, the intermediate conveyance mechanism 90 moves the wafer to the other. In addition, when wafer is in neither the vacuum processing chamber 16 nor the intermediate conveyance chamber 52, the process of the S78 is skipped.

Subsequently, the intermediate conveyance mechanism 90 turns the intermediate conveyance main body portion 91 toward the first load lock chamber 53 (S80) and waits completion of vacuuming of the first load lock chamber 53 (N in S82). When preparation is completed (Y in S82), the intermediate conveyance mechanism 90 conveys the wafer between the first load lock chamber 53 and the intermediate conveyance chamber 52 (S84). When wafers are in both the first load lock chamber 53 and the intermediate conveyance chamber 52, the intermediate conveyance mechanism 90 exchanges positions of the wafers. When wafer is in either the first load lock chamber 53 or the intermediate conveyance chamber 52, the intermediate conveyance mechanism 90 moves the wafer to the other. In addition, when wafer is in neither the first load lock chamber 53 nor the intermediate conveyance chamber 52, the process of the S84 is skipped.

Then, when conveyance of the wafer is not completed (N in S86), the intermediate conveyance mechanism 90 turns the intermediate conveyance main body portion 91 toward the vacuum processing chamber 16 (S88) and waits completion of the implantation process in the vacuum processing chamber 16 (N in S90). When preparation is completed (Y in S90), the intermediate conveyance mechanism 90 conveys the wafer between the vacuum processing chamber 16 and the intermediate conveyance chamber 52 (S92). Then, the intermediate conveyance mechanism 90 turns the intermediate conveyance main body portion 91 toward the second load lock chamber 54 (S94), the intermediate conveyance mechanism 90 repeats the processes of S70 to S86. When the conveyance of the wafer is completed (Y in S86), this flow is finished.

According to this embodiment, regarding wafers that are store in the wafer container 59, a pair of two wafers are simultaneously taken out from the wafer container 59 and subjected to the ion implantation process, and then the pair of wafers are simultaneously stored. Therefore, compared to a method in which wafers are taken out from the wafer container 59 one by one and the wafers are stored into the wafer container 59 one by one, a period required for conveying wafers in relation to the wafer container 59 can be reduced.

According to this embodiment, the first conveyance mechanism 80 takes out a wafer from the wafer container 59, and then the second conveyance mechanism. 85 brings the wafer into the alignment device 66 through handing over via the buffer device 60. Accordingly, the process in which a pair of two wafers is brought into the alignment device 66 in order is performed by not the first conveyance mechanism 80 but the second conveyance mechanism 85. As a result, the number of processing steps of the first conveyance mechanism 80 and the number of processing steps of the second conveyance mechanism 85 can be equalized, as illustrated in the flow charts of FIGS. 28 and 29. When the process in which a wafer is brought into the alignment device 66 is performed by the first conveyance mechanism 80, the number of processing steps of the first conveyance mechanism 80 and the second conveyance mechanism 85 may be reduced in total as many as the number of the processes of handing over via the buffer device 60 that are removed.

However, the first conveyance mechanism 80 is severely burdened with processes, and thus the processes in the first conveyance mechanism 80 become a bottleneck. As a result, a period required for conveying wafers increases in total. According to this embodiment, wafers are handed over to the second conveyance mechanism 85 from the first conveyance mechanism 80 via the buffer device 60, in such a manner that a period required for conveying the wafers is reduced in total. Therefore, the processing capacity of the wafer conveyance device 50 can be increased.

According to this embodiment, since the exchange of wafers between the first conveyance mechanism 80 and the first load lock chamber 53 are realized by the swapping operation, a period in which the first load lock chamber 53 is kept under the atmospheric pressure can be reduced. Similarly, since the exchange of wafers between the second conveyance mechanism 85 and the second load lock chamber 54 is realized by the swapping operation, a period in which the second load lock chamber 54 is kept under the atmospheric pressure can be reduced. Therefore, a period required for taking out wafers via a load lock chamber is reduced, and thus the processing capacity of the wafer conveyance device 50 can be increased. Furthermore, wafer conveyance capability can be increased without employing a two-stage-type load lock chamber or a two-stage-type alignment device, and thus production cost or maintenance cost can be reduced compared to a case where a two-stage-type device is employed. In addition, it is possible to employ a one-stage-type load lock chamber having a relatively simple and small-volume structure, and thus a period required for vacuuming or venting of the load lock chamber can be reduced.

According to this embodiment, exchange of the wafers between the vacuum processing chamber 16 and the intermediate conveyance chamber 52 is realized by the swapping operation, and thus a period in which the implantation process is stopped in the vacuum processing chamber 16 to exchange the wafers can be reduced. Therefore, it is possible to increase productivity of the ion implantation apparatus 10 by enhancing an operation rate of the implantation process in the vacuum processing chamber 16.

According to this embodiment, the buffer device 60 is disposed at the position at which the buffer device 60 and the alignment device 66 overlap each other in the vertical direction, and thus it is possible to reduce the turning operation of the first conveyance mechanism 80 and the second conveyance mechanism 85. When, for example, the first conveyance mechanism 80 brings the wafer into the buffer device 60 (S12 of FIG. 28), and then the wafer is taken out from the alignment device 66 (S16 of FIG. 28), it is not necessary to turn the first conveyance main body portion 81. Similarly, when the second conveyance mechanism 85 takes out the wafer from the buffer device 60 (S42 of FIG. 29), and then the wafer is brought into the alignment device 66 (S44 of FIG. 29), it is not necessary to turn the second conveyance main body portion 86. As a result, it is possible to increase processing ability of the wafer conveyance device 50 by reducing a period required for each process.

According to this embodiment, it is configured such that the intermediate conveyance mechanism 90 is provided in the intermediate conveyance chamber 52 separate from the vacuum processing chamber 16, and thus it is possible to reduce influence of contamination which occurs by entering of, for example, particles into the vacuum processing chamber 16 which can be generated due to the operation of the intermediate conveyance mechanism 90. Therefore, it is possible to increase the productivity of the ion implantation apparatus 10 by increasing a yield ratio of the ion implantation process.

The embodiments of the present invention are not limited to those described above and appropriate combinations or replacements of the features of the embodiments are also encompassed by the present invention. The embodiments may be modified by way of combinations, rearranging of the processing sequence, design changes, etc., based on the knowledge of a skilled person, and such modifications are also within the scope of the present invention.

In the embodiment described above, a case in which the first conveyance mechanism 80 that is located on a left side when viewed from the load port 58 takes out the wafer from the wafer container (which is the first container 59a or the second container 59b) and brings the wafer into the wafer container is described. In a modified example, the second conveyance mechanism 85 that is located on a right side when viewed from the load port 58 may take out the wafer from the wafer container (which is the third container 59c or the fourth container 59d) and bring the wafer into the wafer container. In this case, the roles of the first conveyance mechanism 80 and the second conveyance mechanism 85 may be reversed, and thus the first conveyance mechanism 80 is operated based on the flow chart of FIG. 29 and the second conveyance mechanism 85 is operated based on the flow chart of FIG. 28. In addition, the roles of the first conveyance mechanism 80 and the second conveyance mechanism 85 may be reversed in the middle of the wafer conveyance process.

In the embodiment described above, a case in which the first buffer 61 that is provided in the uppermost stage of the buffer device 60 is set as a storage location of the wafer subjected to the implantation process and the second buffer 62 and the third buffer 63 that are disposed below the first buffer 61 are set as a storage location of the wafer not subjected to the implantation process is described. In a modified example, the first buffer 61 and the second buffer 62 may be set as the storage location of the wafer not subjected to the implantation process and the third buffer 63 may be set as the storage location of the wafer not subjected to the implantation process.

In the embodiment described above, a case in which the buffer device 60 is provided above the alignment device 66 in the vertical direction is described. However, in a modified example, the buffer device 60 may be provided below the alignment device 66 in the vertical direction is described. In addition, the buffer devices may be provided in both a position above the alignment device 66 and a position below the alignment device 66 in the vertical direction. In this case, the buffer device that is located above the alignment device 66 may be set as the storage location of the wafer not subjected to the implantation process and the buffer device that is located below the alignment device 66 may be set as the storage location of the wafer subjected to the implantation process or the roles of the buffer devices may be reversed.

It should be understood that the invention is not limited to the above-described embodiment, but may be modified into various forms on the basis of the spirit of the invention. Additionally, the modifications are included in the scope of the invention.

What is claimed is:

1. An ion implantation apparatus comprising:
a vacuum processing chamber in which an ion implantation process is performed;

an intermediate conveyance chamber that is provided to communicate with the vacuum processing chamber;
a first load lock chamber and a second load lock chamber that are respectively provided at positions at which the first load lock chamber and the second load lock chamber face each other with interposing the intermediate conveyance chamber and communicate with the intermediate conveyance chamber;
an intermediate conveyance mechanism that is provided in the intermediate conveyance chamber and performs wafer conveyance between the vacuum processing chamber and the first load lock chamber via the intermediate conveyance chamber and wafer conveyance between the vacuum processing chamber and the second load lock chamber via the intermediate conveyance chamber;
a first conveyance mechanism that is provided at a position at which the first conveyance mechanism faces the first load lock chamber, brings a wafer into the first load lock chamber, and takes out a wafer from the first load lock chamber;
a second conveyance mechanism that is provided at a position at which the second conveyance mechanism faces the second load lock chamber, brings a wafer into the second load lock chamber, and takes out a wafer from the second load lock chamber;
an alignment device that is provided at a position between the first conveyance mechanism and the second conveyance mechanism and configured to be able to adjust a rotation position of a wafer;
a buffer device that is provided at a position between the first conveyance mechanism and the second conveyance mechanism and configured to be able to temporarily hold two or more wafers;
a load port that allows a wafer container in which a plurality of wafers that are targets of the ion implantation process are stored to be fixed at a position at which the wafer container faces the first conveyance mechanism; and
a controller that controls operations of at least the first conveyance mechanism and the second conveyance mechanism,
wherein the first conveyance mechanism has a first arm capable of holding a wafer and a second arm capable of holding a wafer,
wherein the second conveyance mechanism has a third arm capable of holding a wafer and a fourth arm capable of holding a wafer,
wherein the intermediate conveyance mechanism has a fifth arm capable of holding a wafer and a sixth arm capable of holding a wafer,
wherein, in relation to a first wafer and a second wafer of the plurality of wafers that are stored in the wafer container, conveyed in order, and become targets of the ion implantation process,
(a) the controller operates the first conveyance mechanism such that the first arm and the second arm convey the first wafer and the second wafer to the buffer device from the wafer container;
(b) the controller operates the second conveyance mechanism such that the third arm conveys the first wafer to the alignment device from the buffer device and the fourth arm takes out the second wafer from the buffer device and temporarily holds the second wafer;
(c) the controller operates the second conveyance mechanism such that the third arm takes out the first wafer subjected to alignment from the alignment device and the fourth arm brings the second wafer into the alignment device;
(d) the controller operates the second conveyance mechanism such that the third arm brings the first wafer subjected to alignment into the second load lock chamber;
(e) the controller operates the first conveyance mechanism such that the first arm conveys the second wafer subjected to alignment to the first load lock chamber from the alignment device;
(f) the controller operates the intermediate conveyance mechanism such that the fifth arm conveys the first wafer to the vacuum processing chamber from the second load lock chamber;
(g) the controller operates the intermediate conveyance mechanism such that the fifth arm conveys the second wafer to the intermediate conveyance chamber from the first load lock chamber; and
(h) the controller operates the intermediate conveyance mechanism such that the sixth arm conveys the first wafer subjected to an implantation process to the intermediate conveyance chamber from the vacuum processing chamber and the fifth arm conveys the second wafer to the vacuum processing chamber from the intermediate conveyance chamber,
wherein, in the intermediate conveyance mechanism, a wafer holder of the fifth arm is configured to be able to move in a horizontal direction in a fifth horizontal plane and a wafer holder of the sixth arm is configured to be able to move in the horizontal direction in a sixth horizontal plane that is located below the fifth horizontal plane, and
wherein the controller operates the intermediate conveyance mechanism such that a swapping operation in which the first wafer and the second wafer pass each other in a positional relationship in which the second wafer that is held by the fifth arm and moved to the vacuum processing chamber is located on an upper side and the first wafer that is held by the sixth arm and moved away from the vacuum processing chamber is located on a lower side is performed in an operation of (h).

2. The ion implantation apparatus according to claim 1, wherein the controller operates the first conveyance mechanism such that the first wafer and the second wafer are taken out from the wafer container in parallel in an operation of (a).

3. The ion implantation apparatus according to claim 1, wherein, further, in relation to a third wafer and a fourth wafer of the plurality of wafers that are stored in the wafer container, conveyed in order, and become targets of the ion implantation process,
(i) the controller operates the first conveyance mechanism such that the first arm and the second arm convey the third wafer and the fourth wafer to the buffer device from the wafer container;
(j) the controller operates the second conveyance mechanism such that the third arm conveys the third wafer to the alignment device from the buffer device and the fourth arm takes out the fourth wafer from the buffer device and temporarily holds the fourth wafer;
(k) the controller operates the second conveyance mechanism such that the third arm takes out the third wafer subjected to alignment from the alignment device and the fourth arm brings the fourth wafer into the alignment device;

(l) the controller operates the second conveyance mechanism such that the third arm brings the third wafer subjected to alignment into the second load lock chamber; and (m) the controller operates the first conveyance mechanism such that the first arm conveys the fourth wafer subjected to alignment to the first load lock chamber from the alignment device, and wherein an operation of (i) is performed prior to an operation of (e).

4. The ion implantation apparatus according to claim 3, wherein, further, (n) the controller operates the intermediate conveyance mechanism such that the fifth arm conveys third wafer not subjected to the implantation process to the intermediate conveyance chamber from the second load lock chamber and the sixth arm conveys the first wafer subjected to the implantation process to the second load lock chamber from the intermediate conveyance chamber;

(o) the controller operates the intermediate conveyance mechanism such that the sixth arm conveys the second wafer subjected to the implantation process to the intermediate conveyance chamber from the vacuum processing chamber and the fifth arm conveys the third wafer to the vacuum processing chamber from the intermediate conveyance chamber; and (p) the controller operates the intermediate conveyance mechanism such that the fifth arm conveys the fourth wafer not subjected to the implantation process to the intermediate conveyance chamber from the first load lock chamber and the sixth arm conveys the second wafer subjected to the implantation process to the first load lock chamber from the intermediate conveyance chamber.

5. The ion implantation apparatus according to claim 4, wherein, further, (q) the controller operates the second conveyance mechanism such that the fourth arm takes out the first wafer subjected to the implantation process from the second load lock chamber;

(r) the controller operates the second conveyance mechanism such that the fourth arm brings the first wafer subjected to the implantation process into the buffer device;

(s) the controller operates the first conveyance mechanism such that the second arm takes out the second wafer subjected to the implantation process from the first load lock chamber;

(t) the controller operates the first conveyance mechanism such that the first arm takes out the first wafer subjected to the implantation process from the buffer device; and (u) the controller operates the first conveyance mechanism such that the first arm stores the first wafer subjected to the implantation process into the wafer container and the second arm stores the second wafer subjected to the implantation process into the wafer container.

6. The ion implantation apparatus according to claim 5, wherein the controller operates the first conveyance mechanism such that the first wafer and the second wafer are stored into the wafer container in parallel in an operation of (u).

7. The ion implantation apparatus according to claim 5, wherein, further, in relation to a fifth wafer and a sixth wafer of the plurality of wafers that are stored in the wafer container, conveyed in order, and become targets of the ion implantation process, (v) the controller operates the first conveyance mechanism such that the first arm and the second arm convey the fifth wafer and the sixth wafer to the buffer device from the wafer container;

(w) the controller operates the second conveyance mechanism such that the third arm conveys the fifth wafer to the alignment device from the buffer device and the fourth arm takes out the sixth wafer from the buffer device and temporarily holds the sixth wafer; and (x) the controller operates the second conveyance mechanism such that the third arm takes out the fifth wafer subjected to alignment from the alignment device and the fourth arm brings the sixth wafer into the alignment device, and wherein an operation of (v) is performed prior to an operation of (m), and wherein operations of (w) and (x) are performed prior to an operation of (q), and wherein the controller operates the second conveyance mechanism such that the third arm brings the fifth wafer subjected to alignment into the second load lock chamber in the operation of (q).

8. The ion implantation apparatus according to claim 7, wherein, in the second conveyance mechanism, a wafer holder of the third arm is configured to be able to move in the horizontal direction in a third horizontal plane and a wafer holder of the fourth arm is configured to be able to move in the horizontal direction in a fourth horizontal plane that is located below the third horizontal plane, and wherein the controller operates the second conveyance mechanism such that a swapping operation in which the first wafer and the fifth wafer pass each other in a positional relationship in which the fifth wafer not subjected to the implantation process that is held by the third arm and moved to the second load lock chamber is located on an upper side and the first wafer subjected to the implantation process that is held by the fourth arm and moved away from the second load lock chamber is located on a lower side is performed in the operation of (q).

9. The ion implantation apparatus according to claim 7, wherein the controller operates the first conveyance mechanism such that the first arm conveys the sixth wafer subjected to alignment to the first load lock chamber from the alignment device in an operation of (s).

10. The ion implantation apparatus according to claim 9, wherein, in the first conveyance mechanism, a wafer holder of the first arm is configured to be able to move in the horizontal direction in a first horizontal plane and a wafer holder of the second arm is configured to be able to move in the horizontal direction in a second horizontal plane that is located below the first horizontal plane, and wherein the controller operates the first conveyance mechanism such that a swapping operation in which the second wafer and the sixth wafer pass each other in a positional relationship in which the sixth wafer not subjected to the implantation process that is held by the first arm and moved to the first load lock chamber is located on an upper side and the second wafer subjected to the implantation process that is held by the second arm and moved away from the first load lock chamber is located on a lower side is performed in the operation of (s).

11. The ion implantation apparatus according to claim 1,
wherein the first load lock chamber and the second load lock chamber are arranged at positions at which the first load lock chamber and the second load lock chamber are symmetric with respect to a center line that connects the vacuum processing chamber and the intermediate conveyance chamber, and
wherein the first conveyance mechanism and the second conveyance mechanism are arranged at positions at which the first conveyance mechanism and the second conveyance mechanism are symmetric with respect to the center line, and
wherein the alignment device and the buffer device are arranged on the center line.

12. The ion implantation apparatus according to claim 1,
wherein the buffer device is configured to be able to simultaneously hold at least three wafers including two wafers not subjected to the implantation process and a wafer subjected to the implantation process.

13. An ion implantation apparatus comprising:
a vacuum processing chamber in which an ion implantation process is performed;
an intermediate conveyance chamber that is provided to communicate with the vacuum processing chamber;
a first load lock chamber and a second load lock chamber that are respectively provided at positions at which the first load lock chamber and the second load lock chamber face each other with interposing the intermediate conveyance chamber and communicate with the intermediate conveyance chamber;
an intermediate conveyance mechanism that is provided in the intermediate conveyance chamber and performs wafer conveyance between the vacuum processing chamber and the first load lock chamber via the intermediate conveyance chamber and wafer conveyance between the vacuum processing chamber and the second load lock chamber via the intermediate conveyance chamber;
a first conveyance mechanism that is provided at a position at which the first conveyance mechanism faces the first load lock chamber, brings a wafer into the first load lock chamber, and takes out a wafer from the first load lock chamber;
a second conveyance mechanism that is provided at a position at which the second conveyance mechanism faces the second load lock chamber, brings a wafer into the second load lock chamber, and takes out a wafer from the second load lock chamber;
an alignment device that is provided at a position between the first conveyance mechanism and the second conveyance mechanism and configured to be able to adjust a rotation position of a wafer;
a buffer device that is provided at a position between the first conveyance mechanism and the second conveyance mechanism and configured to be able to temporarily hold two or more wafers;
a load port that allows a wafer container in which a plurality of wafers that are targets of the ion implantation process are stored to be fixed at a position at which the wafer container faces the first conveyance mechanism; and
a controller that controls operations of at least the first conveyance mechanism and the second conveyance mechanism,
wherein the first conveyance mechanism has a first arm capable of holding a wafer and a second arm capable of holding a wafer,
wherein the second conveyance mechanism has a third arm capable of holding a wafer and a fourth arm capable of holding a wafer,
wherein, in relation to a first wafer and a second wafer of the plurality of wafers that are stored in the wafer container, conveyed in order, and become targets of the ion implantation process,
(a) the controller operates the first conveyance mechanism such that the first arm and the second arm convey the first wafer and the second wafer to the buffer device from the wafer container;
(b) the controller operates the second conveyance mechanism such that the third arm conveys the first wafer to the alignment device from the buffer device and the fourth arm takes out the second wafer from the buffer device and temporarily holds the second wafer;
(c) the controller operates the second conveyance mechanism such that the third arm takes out the first wafer subjected to alignment from the alignment device and the fourth arm brings the second wafer into the alignment device;
(d) the controller operates the second conveyance mechanism such that the third arm brings the first wafer subjected to alignment into the second load lock chamber; and
(e) the controller operates the first conveyance mechanism such that the first arm conveys the second wafer subjected to alignment to the first load lock chamber from the alignment device,
wherein the buffer device is disposed at a position at which the buffer device and the alignment device overlap each other in a vertical direction, and
wherein the second conveyance mechanism further includes a main body portion that can be raised or lowered in the vertical direction and turned about an axis extending in the vertical direction and the third arm and the fourth arm are attached to the main body portion, and
wherein the controller operates the second conveyance mechanism such that the main body portion is raised or lowered in the vertical direction without turning in operations of (b) and (c).

14. A method for processing a plurality of wafers using an ion implantation apparatus according to claim 1, the method comprising:
(a) conveying a first wafer and a second wafer to the buffer device from the wafer container by the first arm and the second arm;
(b) conveying the first wafer to the alignment device from the buffer device by the third arm, taking out the second wafer from the buffer device by the fourth arm, and holding the second wafer temporarily;
(c) taking out the first wafer subjected to alignment from the alignment device by the third arm and bringing the second wafer into the alignment device by the fourth arm;
(d) bringing the first wafer subjected to alignment into the second load lock chamber by the third arm; and
(e) conveying the second wafer subjected to alignment to the first load lock chamber from the alignment device by the first arm.

15. The method according to claim 14, further comprising:

(f) conveying the first wafer to the vacuum processing chamber from the second load lock chamber by the fifth arm;
(g) conveying the second wafer to the intermediate conveyance chamber from the first load lock chamber by the fifth arm;
(h) conveying the first wafer subjected to an implantation process to the intermediate conveyance chamber from the vacuum processing chamber by the sixth arm and conveying the second wafer to the vacuum processing chamber from the intermediate conveyance chamber by the fifth arm,
wherein a swapping operation in which the first wafer and the second wafer pass each other in a positional relationship in which the second wafer that is held by the fifth arm and moved to the vacuum processing chamber is located on an upper side and the first wafer that is held by the sixth arm and moved away from the vacuum processing chamber is located on a lower side is performed in an operation of (h).

* * * * *